United States Patent
Anderson et al.

(10) Patent No.: US 12,073,674 B2
(45) Date of Patent: *Aug. 27, 2024

(54) ELECTRONIC DOOR SYSTEM

(71) Applicant: Therma-Tru Corporation, Maumee, OH (US)

(72) Inventors: Kevin Anderson, Oak Creek, WI (US);
John Bartucci, Oak Creek, WI (US);
Logan Harvey, Maumee, OH (US);
Scott Kalous, Oak Creek, WI (US);
Bert Spellman, Maumee, OH (US);
Michael Stagg, Maumee, OH (US);
Garett Strandemo, Maumee, OH (US)

(73) Assignee: Therma-Tru Corporation, Maumee, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/424,382

(22) Filed: Jan. 26, 2024

(65) Prior Publication Data

US 2024/0161562 A1    May 16, 2024

Related U.S. Application Data

(63) Continuation of application No. 17/843,787, filed on Jun. 17, 2022, now Pat. No. 11,922,748, which is a
(Continued)

(51) Int. Cl.
*G07C 9/00* (2020.01)
*E05B 47/00* (2006.01)
(Continued)

(52) U.S. Cl.
CPC .......... *G07C 9/00944* (2013.01); *E05B 47/00* (2013.01); *E05D 11/0081* (2013.01);
(Continued)

(58) Field of Classification Search
CPC ............ G07C 9/00944; G07C 9/00571; G07C 2009/00769; E05B 47/00
See application file for complete search history.

(56) References Cited

U.S. PATENT DOCUMENTS 3,793,500 A    2/1974  Gerber
4,332,429 A    6/1982  Frick et al.
(Continued)

FOREIGN PATENT DOCUMENTS

CN    103223896 B    7/2013
CN    106711688 A    5/2017
(Continued)

OTHER PUBLICATIONS

Final Office Action on U.S. Appl. No. 16/530,957 dtd Jul. 22, 2022, 13 pages.
(Continued)

*Primary Examiner* — Nabil H Syed
(74) *Attorney, Agent, or Firm* — Foley & Lardner LLP

(57) ABSTRACT

A door system includes a door jamb, a door panel including a box disposed therealong, a hinge coupling an edge of the door panel to the door jamb, a flexible conduit extending from the door jamb to the edge of the door panel, and a plurality of electronic components. The flexible conduit is configured to facilitate electrically coupling one or more of the plurality of electronic components to an external power source. The plurality of electronic components include a camera disposed within the box, a light integrated into the door jam, a sensor configured to facilitate detecting at least one of sound or activity proximate the door panel, and a backup battery disposed within at least one of the door jamb or the door panel. The backup battery is configured to power at least one of the plurality of electronic components during power loss from the external power source.

20 Claims, 19 Drawing Sheets

Related U.S. Application Data continuation of application No. 17/072,950, filed on Oct. 16, 2020, now Pat. No. 11,373,471, which is a continuation of application No. 16/530,960, filed on Aug. 2, 2019, now abandoned.

(60) Provisional application No. 62/714,273, filed on Aug. 3, 2018.

(51) Int. Cl.

| | | |
|---|---|---|
| *E05D 11/00* | (2006.01) | |
| *E06B 7/28* | (2006.01) | |
| *E06B 9/24* | (2006.01) | |
| *F21V 33/00* | (2006.01) | |
| *H04B 1/04* | (2006.01) | |
| *H04N 7/18* | (2006.01) | |
| *H04N 23/54* | (2023.01) | |
| *H04W 4/80* | (2018.01) | |
| *H05K 7/02* | (2006.01) | |
| *H02G 11/00* | (2006.01) | |

(52) U.S. Cl.
CPC ............... *E06B 7/28* (2013.01); *E06B 9/24* (2013.01); *F21V 33/006* (2013.01); *G07C 9/00309* (2013.01); *G07C 9/00571* (2013.01); *H04B 1/04* (2013.01); *H04N 7/183* (2013.01); *H04N 7/186* (2013.01); *H04N 23/54* (2023.01); *H04W 4/80* (2018.02); *H05K 7/02* (2013.01); *E06B 2009/2417* (2013.01); *E06B 2009/2464* (2013.01); *G07C 2009/00769* (2013.01); *H02G 11/00* (2013.01)

(56) References Cited

U.S. PATENT DOCUMENTS

| | | | |
|---|---|---|---|
| 5,398,175 | A | 3/1995 | Pea |
| 5,541,585 | A | 7/1996 | Duhame et al. |
| 5,586,895 | A | 12/1996 | Zehrung |
| 6,049,287 | A | 4/2000 | Yulkowski |
| 6,064,316 | A | 5/2000 | Glick et al. |
| 8,539,717 | B2 | 9/2013 | Speyer et al. |
| 8,772,970 | B2 | 7/2014 | Lambrou |
| 9,644,399 | B2 | 5/2017 | Johnson et al. |
| 9,683,391 | B2 | 6/2017 | Johnson et al. |
| 9,685,015 | B2 | 6/2017 | Johnson |
| 9,685,017 | B2 | 6/2017 | Johnson |
| 9,691,198 | B2 | 6/2017 | Cheng et al. |
| 9,691,203 | B1 | 6/2017 | Shen |
| 9,702,168 | B2 | 7/2017 | Jadallah et al. |
| 9,704,320 | B2 | 7/2017 | Johnson et al. |
| 9,727,328 | B2 | 8/2017 | Johnson |
| 9,761,073 | B2 | 9/2017 | Yu et al. |
| 9,761,074 | B2 | 9/2017 | Cheng et al. |
| 9,767,632 | B2 | 9/2017 | Johnson |
| 9,916,746 | B2 | 3/2018 | Johnson et al. |
| 10,017,963 | B2 | 7/2018 | Johnson et al. |
| 10,304,273 | B2 | 5/2019 | Johnson et al. |
| 10,328,900 | B1 | 6/2019 | Yakovenko et al. |
| 10,361,880 | B1 | 7/2019 | Marcinkowski et al. |
| 10,388,094 | B2 | 8/2019 | Johnson |
| 10,443,266 | B2 | 10/2019 | Johnson et al. |
| 10,445,999 | B2 | 10/2019 | Johnson et al. |
| 10,616,721 | B2 | 4/2020 | Theurer et al. |
| 10,691,953 | B2 | 6/2020 | Johnson et al. |
| 11,268,300 | B2 | 3/2022 | Langenberg et al. |
| 11,739,583 | B2 | 8/2023 | Sorice et al. |
| 2004/0085205 | A1 | 5/2004 | Yeh |
| 2005/0068629 | A1 | 3/2005 | Fernando et al. |
| 2006/0007005 | A1 | 1/2006 | Yui et al. |
| 2006/0010793 | A1 | 1/2006 | Martino |
| 2006/0156361 | A1 | 7/2006 | Wang et al. |
| 2006/0164205 | A1 | 7/2006 | Buckingham et al. |
| 2008/0013303 | A1 | 1/2008 | Guarino |
| 2009/0313790 | A1 | 12/2009 | Schau |
| 2010/0283579 | A1 | 11/2010 | Kraus et al. |
| 2012/0280783 | A1 | 11/2012 | Gerhardt et al. |
| 2013/0186001 | A1 | 7/2013 | Cui et al. |
| 2015/0027178 | A1 | 1/2015 | Scalisi |
| 2016/0049025 | A1 | 2/2016 | Johnson |
| 2016/0105650 | A1 | 4/2016 | Carter |
| 2016/0239001 | A1 | 8/2016 | Chin et al. |
| 2016/0275781 | A1 | 9/2016 | Nold |
| 2016/0284181 | A1 | 9/2016 | Johnson |
| 2016/0319569 | A1 | 11/2016 | Johnson et al. |
| 2016/0319571 | A1 | 11/2016 | Johnson |
| 2017/0040827 | A1 | 2/2017 | Weber |
| 2017/0193724 | A1 | 7/2017 | Johnson et al. |
| 2017/0228603 | A1 | 8/2017 | Johnson |
| 2017/0265124 | A1 | 9/2017 | Seemann et al. |
| 2017/0284129 | A1 | 10/2017 | King |
| 2018/0073274 | A1 | 3/2018 | Johnson et al. |
| 2018/0088431 | A1 | 3/2018 | Holt et al. |
| 2018/0135337 | A1 | 5/2018 | Johnson et al. |
| 2018/0179786 | A1 | 6/2018 | Johnson |
| 2018/0189117 | A1 | 7/2018 | Shrivastava et al. |
| 2018/0268675 | A1 | 9/2018 | Johnson et al. |
| 2018/0283049 | A1 | 10/2018 | Shiner et al. |
| 2018/0364662 | A1 | 12/2018 | Meganathan et al. |
| 2019/0019364 | A9 | 1/2019 | Cheng et al. |
| 2019/0130686 | A1 | 5/2019 | Cheng et al. |
| 2019/0130687 | A1 | 5/2019 | Johnson |
| 2019/0130712 | A1 | 5/2019 | Johnson et al. |
| 2020/0236509 | A1 | 7/2020 | Theurer et al. |
| 2020/0250946 | A1 | 8/2020 | Johnson et al. |
| 2021/0035394 | A1 | 2/2021 | Anderson et al. |
| 2021/0207419 | A1 | 7/2021 | Sorice et al. |
| 2021/0207420 | A1 | 7/2021 | Sorice et al. |
| 2021/0207421 | A1 | 7/2021 | Sorice et al. |
| 2022/0108228 | A1 | 4/2022 | Salter et al. |

FOREIGN PATENT DOCUMENTS

| | | |
|---|---|---|
| CN | 206283038 U | 6/2017 |
| CN | 206283075 U | 6/2017 |
| CN | 206865208 U | 1/2018 |
| JP | 10-102907 A | 4/1998 |
| KR | 1020020088996 A | 11/2002 |
| KR | 101632944 B1 | 7/2016 |
| WO | WO-2007/082959 A1 | 7/2007 |
| WO | WO-2019/102502 A1 | 5/2019 |

OTHER PUBLICATIONS

International Preliminary Report on Patentability on PCT PCT/US2019/045010 dated Feb. 18, 2021, 7 pages.

International Search Report and Written Opinion dated Oct. 20, 2023, from PCT/US2023/026767, 21 pages.

International Search Report and Written Opinion received for PCT application No. PCT/US2019/045010, 11 pages.

Non-Final Office Action on U.S. Appl. No. 16/530,957 dated Dec. 15, 2021, 12 pages.

Non-Final Office Action on U.S. Appl. No. 16/530,960 dtd Jun. 16, 2020, 20 pages.

Notice of Allowance on U.S. Appl. No. 16/530,957 dtd Oct. 12, 2022, 9 pages.

U.S. Office Action on U.S. Appl. No. 17/072,950 dated Aug. 18, 2021, 15 pages.

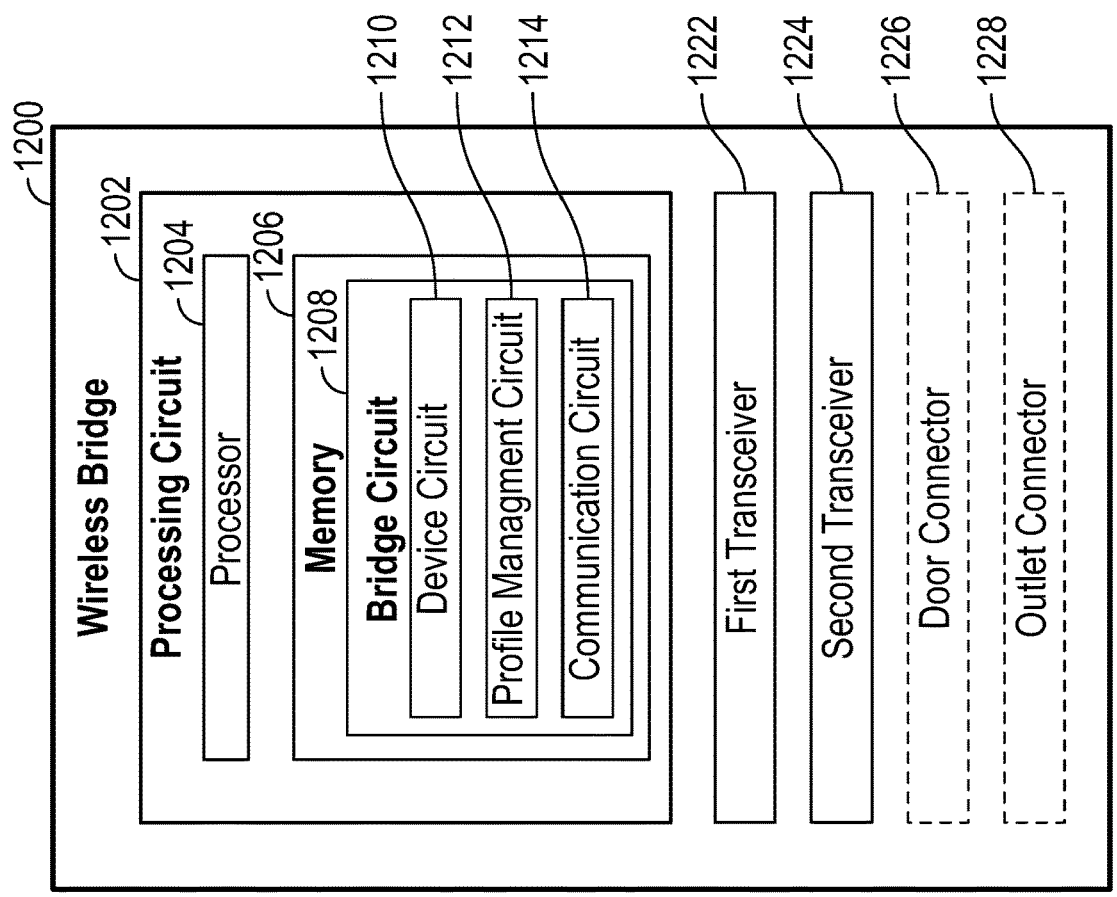

ELECTRONIC DOOR SYSTEM

CROSS-REFERENCE TO RELATED PATENT APPLICATION

This application is a continuation of U.S. patent application Ser. No. 17/843,787, filed Jun. 17, 2022, which is a continuation of U.S. patent application Ser. No. 17/072,950, filed Oct. 16, 2020, which is a continuation of U.S. patent application Ser. No. 16/530,960, filed Aug. 2, 2019, which claims the benefit of and priority to U.S. Provisional Application No. 62/714,273, filed Aug. 3, 2018, all of which are incorporated herein by reference in their entireties.

BACKGROUND

Electronic entry door features, such as electronic door locks (e.g., push button, biometric sensor, RFID reader), intercoms, cameras, motion sensors, and lighting, have been provided as modular, battery powered solutions for installation on or near an entry door, to provide additional security and convenience, and may, for example, provide for remote communication with a user (e.g., homeowner, business owner, resident, or employee), for example, through wireless communication (e.g., Wi-Fi or cellular) with the user's cell phone, tablet, or computer.

SUMMARY

One embodiment relates to a door system. The door system includes a door jamb, a door panel including a box disposed therealong and embedded therein, a hinge coupling an edge of the door panel to the door jamb, a flexible conduit extending from the door jamb to the edge of the door panel, a plurality of electronic components, and a control system. The flexible conduit is configured to facilitate electrically coupling one or more of the plurality of electronic components to an external power source. The plurality of electronic components include a camera disposed within the box of the door panel, a light integrated into the door jamb, a sensor configured to facilitate detecting at least one of sound or activity proximate the door panel, and a backup battery disposed within at least one of the door jamb or the door panel. The backup battery is configured to power at least one of the plurality of electronic components in an event of power loss from the external power source. The control system is configured to acquire data from one or more of the plurality of electronic components and at least one of (i) transmit the data to a server or (ii) control one or more of the plurality of electronic components based on the data.

Another embodiment relates to a door system. The door system includes a door jamb, a door panel including a box disposed therealong, a hinge coupling an edge of the door panel to the door jamb, a flexible conduit extending from the door jamb to the edge of the door panel, and a plurality of electronic components. The flexible conduit is configured to facilitate electrically coupling one or more of the plurality of electronic components to an external power source. The plurality of electronic components include a camera disposed within the box, a light integrated into the door jam, a sensor configured to facilitate detecting at least one of sound or activity proximate the door panel, and a backup battery disposed within at least one of the door jamb or the door panel. The backup battery is configured to power at least one of the plurality of electronic components in an event of power loss from the external power source.

Still another embodiment relates to a door system. The door system includes a door jamb, a door panel, a hinge coupling an edge of the door panel to the door jamb, a flexible conduit extending from the door jamb to the edge of the door panel, a plurality of electronic components, and a control system. The flexible conduit is configured to facilitate electrically coupling one or more of the plurality of electronic components to an external power source. The plurality of electronic components include a camera, a sensor including at least one of a doorbell sensor, a proximity sensor, or a motion sensor, a light integrated into the door jamb, and a backup battery configured to power at least one of the plurality of electronic components in an event of power loss from the external power source. The control system is configured to turn on or turn off the light in response to a command received from a user device and activate at least one of the light or the camera based on a signal received from at least one of the sensor or the camera.

BRIEF DESCRIPTION OF THE DRAWINGS

FIG. 14 is a block diagram of a wireless bridge of the door assembly of FIGS. 12 and 13, according to an exemplary embodiment.

FIG. 15 is a block diagram of a locking system of the door assembly of FIGS. 12 and 13, according to an exemplary embodiment.

DETAILED DESCRIPTION

Before turning to the figures, which illustrate certain exemplary embodiments in detail, it should be understood that the present disclosure is not limited to the details or methodology set forth in the description or illustrated in the figures. It should also be understood that the terminology used herein is for the purpose of description only and should not be regarded as limiting.

As utilized herein, the term "key" (e.g., device key, user key, bridge key, cryptographic key, etc.) means a numeric or alphanumeric code, which, for example, may be a parameter used in a block cipher algorithm that determines a forward cipher function. As utilized herein, the term "nonce" (e.g., handshake nonce, reply nonce, modified reply nonce, etc.) means a value that is used (e.g., only once) within a specified context. The terms "circuit" or "circuitry," as utilized herein, connote hardware, software, or any combination thereof. In other words, a particular circuit described herein may be implemented using hardware components, instructions stored on one or more computer-readable storage media that are executable by processing circuitry (e.g., a microprocessor) to implement the associated functions described herein, or a combination of hardware and executable instructions. All such implementations are contemplated within the scope of the present disclosure.

Electronic Door Arrangements

Figure 8:
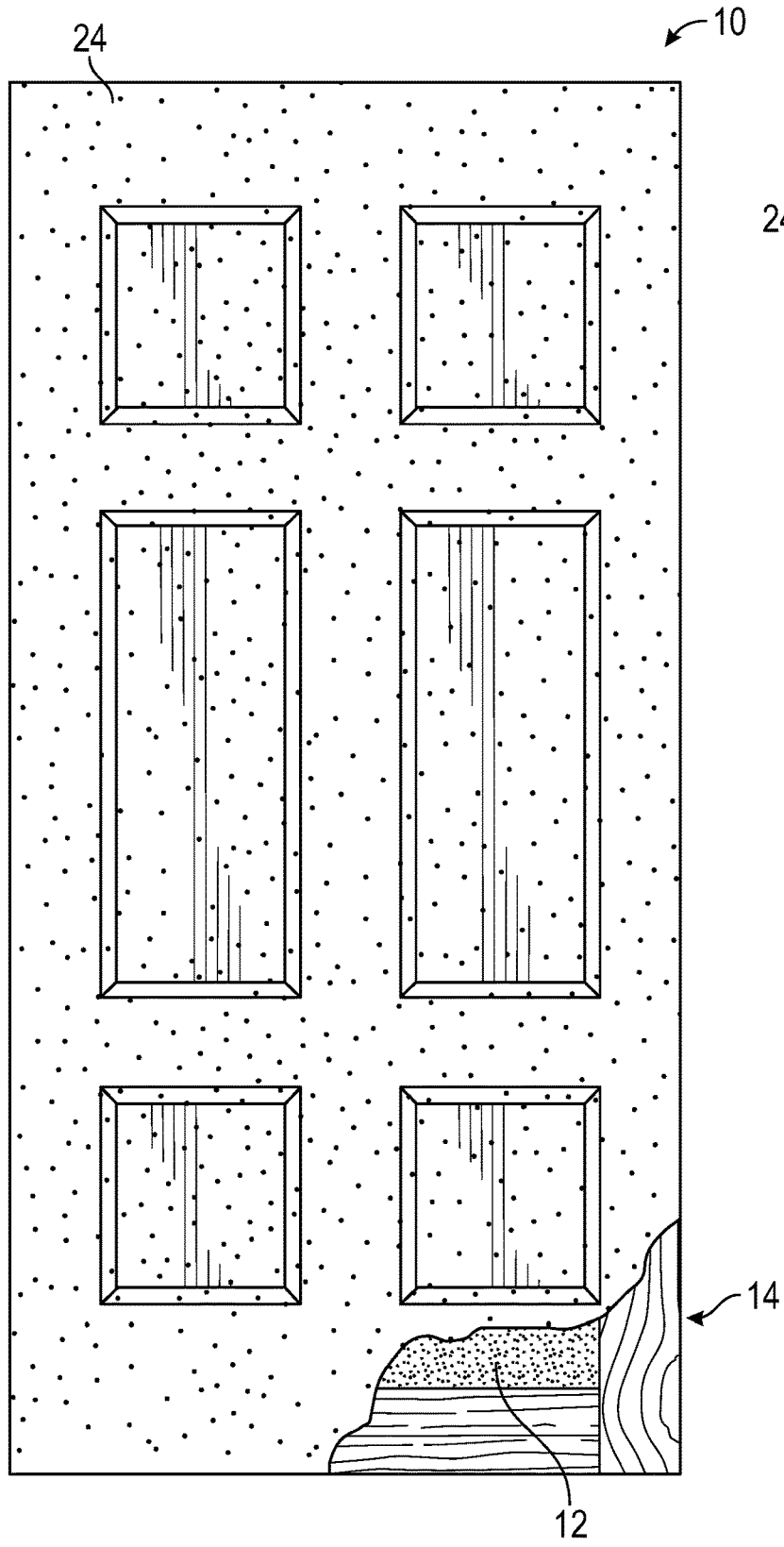
FIG. 8 is a front view of a composite door with a portion removed to expose the internal structure thereof, according to an exemplary embodiment.
Figure 9:
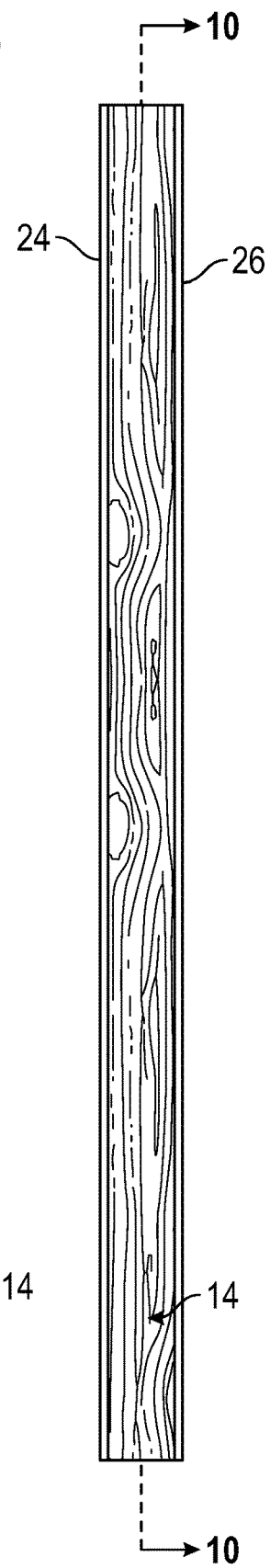
FIG. 9 is a side view of the door of FIG. 8.
Figure 10:
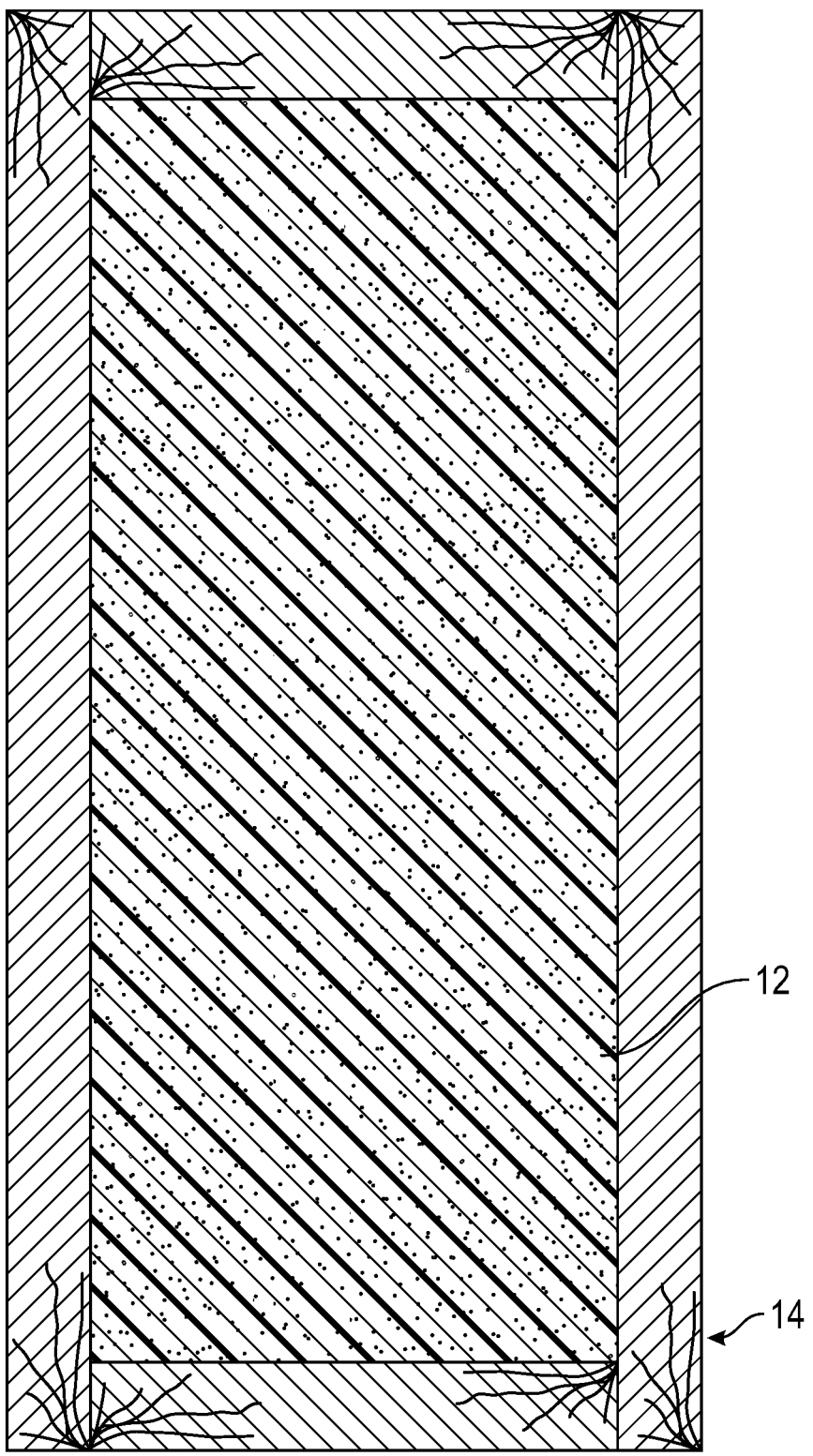
FIG. 10 is a cross-sectional view of the door of FIG. 9 showing the internal structure of thereof.

As shown in FIGS. 8-10, fiberglass doors 10 typically include a door-shaped solid (e.g., wooden) frame member 14, a polymeric foam-type core 12 positioned within the frame member 14, a first or front door skin 24 secured to a first side of the frame member 14, and a second or rear door skin 26 secured to a second side, opposite the first side, of the frame member 14. The front door skin 24 and the rear door skin 26 may, for example, be formed as fiberglass reinforced compression molded panels prepared from a molding compound.

According to an exemplary embodiment, a composite (e.g., having a fiberglass or foam filled frame) door assembly may be provided with one or more electronic features integrated into the door and in wired electrical communication with the building's electrical system to provide an integrated electronic (or "smart") entry door solution, without the need for separate end user installation of one or more modular electronic components.

While the electronic features and systems described herein may be integrated into many types of doors, the foam filled cavity of a composite fiberglass door facilitates incorporation of internal electronic features within the door, without requiring extensive machining or modification, as may be the case with a solid or monolithic door. Fiberglass doors typically include a door-shaped frame member (e.g., having wooden horizontal rails and vertical stiles), first and second fiberglass reinforced compression molded door skins secured to opposed first and second sides of the frame member, and a polymeric foam-type core (e.g., sprayed-in foam or cut block foam pieces) positioned between the door skins and within the frame member.

The door may include, within its foamed-in enclosure, electrical wiring for one or more electronic features, with the electrical wiring extending through a hinged portion (e.g., a hinged edge, etc.) of the door and into the door jamb for connection with the electrical system of the building. Exemplary electrical connections between the door edge and the door jamb, include, for example, electric transfer hinges (e.g., Series 1100 electric hinge, manufactured by ACSI) and flexible conduits (e.g., CDL series "concealed door loop," manufactured by Command Access Technologies).

Figure 1:
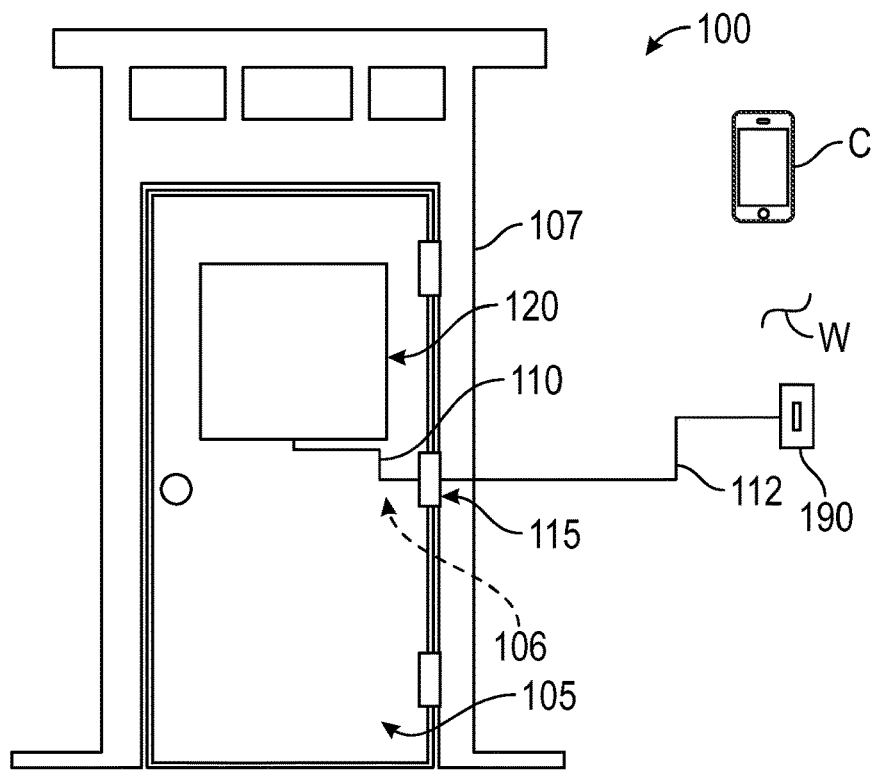
FIG. 1 is a schematic view of an integrated electronic door system with power supplied to the door slab through electrical wiring in the core, according to an exemplary embodiment.

In some embodiments, an electronic feature that is integral to the door, such as, for example, an electrically activated privacy window (as manufactured, for example, by Innovative Glass Corp) may be connected to a building electrical system by electrical wiring integrated into a composite door. As shown in FIG. 1, a door assembly, shown as door system 100, includes an electrically-operated window (e.g., a glass window, etc.), shown as privacy window 120, connected to electrical wiring 110 routed through an interior core (e.g., a foam core, etc.), shown as core 106, of a slab, shown as door slab 105, to a flexible conduit or electric transfer hinge 115 (as shown), and into a jamb, shown as door jamb 107. The electrical wiring 110 may be connected directly or indirectly by external wiring 112 with a switch, shown as control switch 190, installed, for example, on an interior building wall W, and connected with the building electrical system for user activation and deactivation of the privacy window 120. In other embodiments, the control switch 190 is additionally or alternatively disposed directly on a rear surface of the door. In still other embodiments, the control switch 190 is in wireless communication (e.g., RFID, Bluetooth®, infrared, Wi-Fi, etc.) with the privacy window 120 for wireless control of the privacy window 120, for example, through communication with a transceiver connected with the privacy window 120. In still other embodiments, a transceiver connected with the privacy window 120 is configured to communicate with a smart phone or other computing device C for remote user control of the privacy window 120 using, for example, a smart phone application.

The electrical wiring 110 may be installed in the door slab 105 after installation of the core 106, for example, into a slot or other such cutout in the core 106. In one embodiment, a channel for the electrical wiring 110 may be drilled into the core 106 of a completed door, allowing for post-production installation of an integrated electronic system. Alternatively, in other embodiments, the electrical wiring 110 may be installed in the door cavity prior to installation of the core 106. For example, the electrical wiring 110 may be secured (e.g., taped) against an interior surface of at least one of the door skins, and the core 106 may be subsequently installed (e.g., sprayed or inserted) over and/or around the electrical wiring 110.

Figure 2:
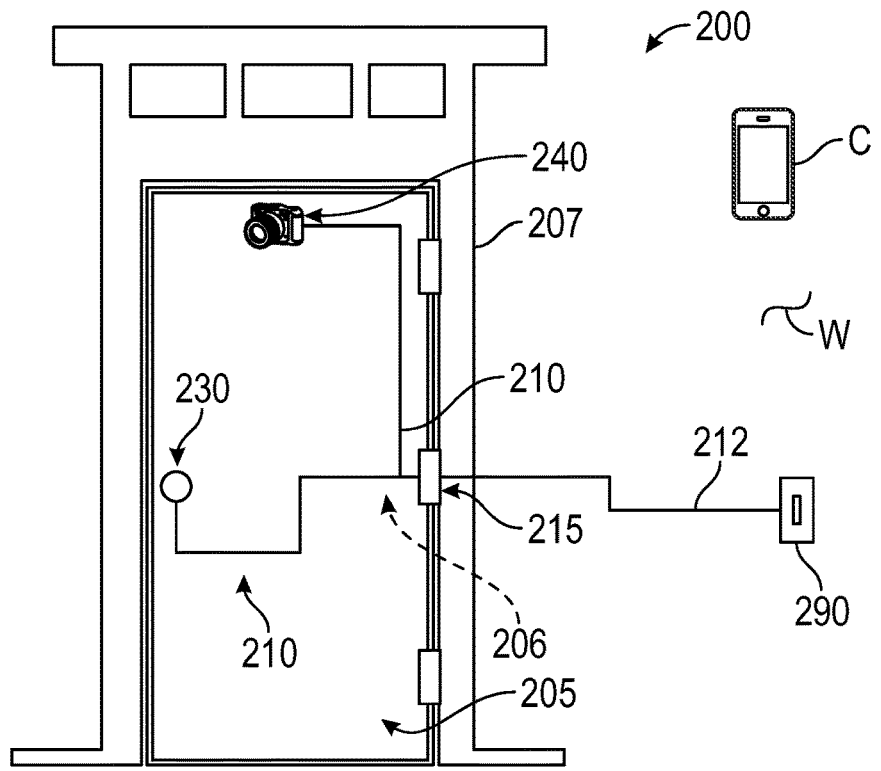
FIG. 2 is a schematic view of an integrated electronic door system with power supplied to the door slab through electrical wiring in the core, according to another exemplary embodiment.

In other embodiments, electronic features conventionally provided as mountable modular electronic components may be integrated into a door slab, with integrated electrical wiring connecting the electronic features to the building electrical system. As shown in FIG. 2, a door assembly, shown as door system 200, includes an electrically-operated locking mechanism (e.g., an electronic door latch, an electronic deadbolt, an electronic strike plate, etc.), shown as door lock 230, and security camera, shown as camera 240, connected to electrical wiring 210 routed through an interior core (e.g., a foam core, etc.), shown as core 206, of a slab, shown as door slab 205, (installed either before or after foam installation, as discussed above) to a flexible conduit or electric transfer hinge 215 (as shown), and into a jamb, shown as door jamb 207. The camera 240 may be fully enclosed within the door slab 205, with only a lens of the camera 240 exposed on a front surface of the door slab 205 (e.g., through an opening in the outer door skin). The camera may 240 be electrically connected with one or more sensors integrated into the door slab 205 (e.g., motion sensors, vibration sensors) to activate the camera 240 when activity at the door system 200 is detected.

To prevent contact between the electronic features and their electrical wiring connections with the core 206 (which may be flammable), the electronic features and their wiring connections may be fully enclosed in housing members embedded in either or both of the outer door frame (e.g., the frame member 14, etc.) and the core 206.

As shown in FIG. 2, the electrical wiring 210 may be connected directly or indirectly by external wiring 212 with a switch, shown as control switch 290, installed on an interior building wall W and connected with the building electrical system for user operation of the door lock 230 and the camera 240 (e.g., for specific control, for powering on/off, etc.). In other embodiments, the control switch 290 is additionally or alternatively disposed directly on a rear surface of the door slab 205. In still other embodiments, the control switch 290 is in wireless communication (e.g., RFID, Bluetooth®, infrared, Wi-Fi, etc.) with any of the electronic door features, for example, through communication with a transceiver connected with the corresponding electronic door feature. Additionally or alternatively, any one or more of the electronic door features may be provided with its own control system (e.g., an integrated controller, etc.) for remote user control of the electronic feature, for example, through wireless communication (e.g., Wi-Fi, cellular, Bluetooth, etc.) with a smart phone or other computing device C (e.g., a locally stored or web-based application). Either or both of the door lock 230 and the camera 240 may be provided with backup battery units, for example, for powered operation of the door lock 230 and/or the camera 240 in the event of loss of power to the building.

Figure 3:
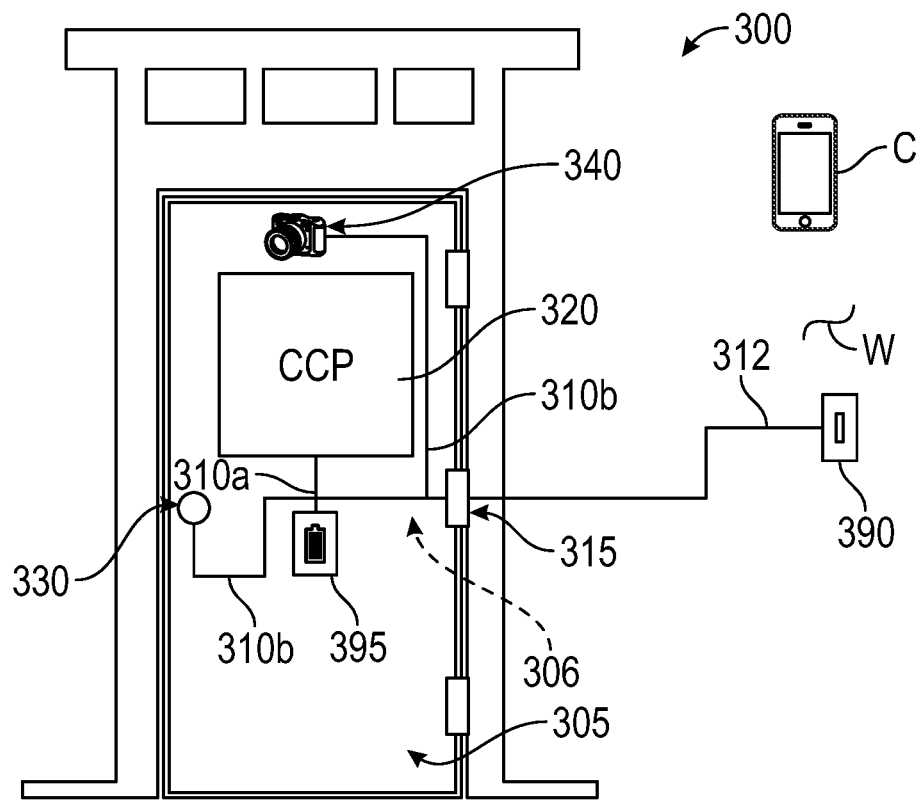
FIG. 3 is a schematic view of an integrated electronic door system with power supplied to the door slab through electrical wiring in the core, according to another exemplary embodiment.

In some integrated electronic door systems, electronic features may require different electrical power supplies (e.g., high voltage and low voltage power supplies). As shown in FIG. 3, a door assembly, shown as door system 300, includes (i) an electrically-operated window (e.g., a glass window, etc.), shown as privacy window 320, connected to first wiring, shown as high voltage electrical wiring 310*a*, and (ii) an electrically-operated locking mechanism, shown as door lock 330, and a security camera, shown as camera 340, connected to second, different wiring, shown as low voltage electrical wiring 310*b*. The high voltage electrical wiring 310*a* and the low voltage electrical wiring 310*b* are routed through an interior core (e.g., a foam core, etc.), shown as core 306, of a slab, shown as door slab 305, (installed either before or after foam installation, as discussed above) to a flexible conduit or electric transfer hinge 315 (as shown), and into a jamb, shown as door jamb 307, for connection with an external power source (e.g., a building power source, etc.). The high voltage electrical wiring 310*a* and the low voltage electrical wiring 310*b* may be connected directly or indirectly by external wiring 312 with a switch, shown as control switch 390, installed on an interior building wall W and connected with the building electrical system for user operation of one or more of the privacy window 320, the door lock 330, and the camera 340 (e.g., for specific control, for powering on/off, etc.). In other embodiments, the control switch 390 is disposed directly on a rear surface of the door slab 205. In still other embodiments, the control switch 390 is in wireless communication (e.g., RFID, Bluetooth®, infrared, Wi-Fi, etc.) with any of the electronic door features, for example, through communication with a transceiver connected with the corresponding electronic door feature.

Additionally or alternatively, any one or more of the electronic door features may be provided with its own control system (e.g., an integrated controller, etc.) for remote user control of the electronic feature, for example, through wireless communication (e.g., Wi-Fi, cellular, Bluetooth, etc.) with a smart phone or other computing device C (e.g., a locally stored or web-based application). Either or both of the door lock 330 and the camera 340 may be provided with backup battery units, for example, for powered operation of the door lock 330 and/or the camera 340 in the event of loss of power to the building. Additionally or alternatively, an internal power supply, shown as backup battery 395, may be integrated into the door slab 305 for connection with one or more of the electronic features of the door system 300 to supply backup power to the electronic features in the event of building power loss. In an exemplary embodiment, the backup battery 395 may be configured to supply only low voltage power to the corresponding low voltage electronic devices (e.g., the door lock 330, the camera 340, etc.) without powering high voltage electronic device(s) (e.g., the privacy window 320, etc.). The backup battery 395 may be a rechargeable battery connected with the building power supply and may be configured to recharge when power to the building is operational and/or restored.

Figure 4:
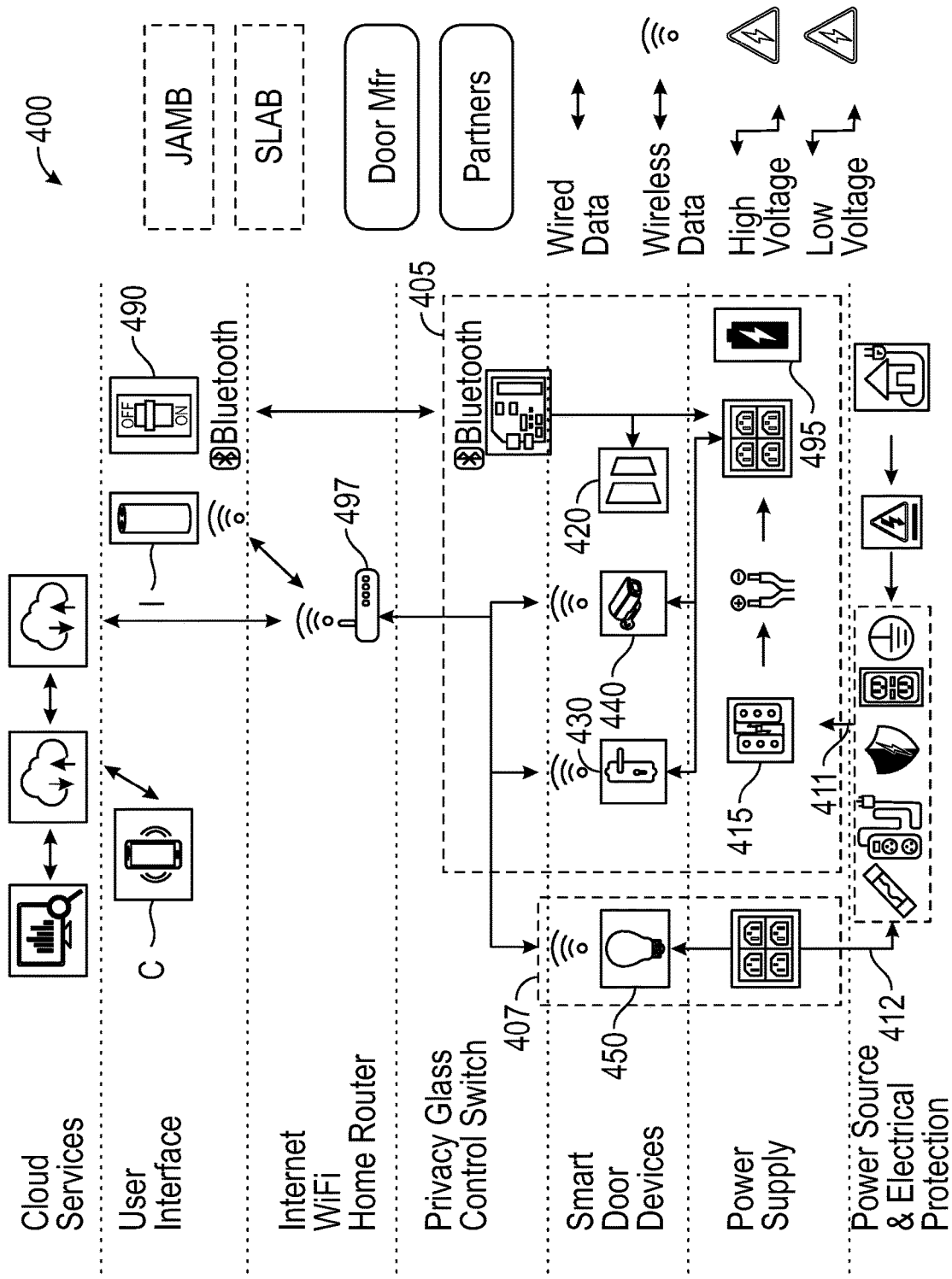
FIG. 4 is a schematic block diagram of an electronic control system for an integrated electronic control system having independently operable electronic features, according to an exemplary embodiment.

Referring now to FIG. 4, a schematic block diagram of an electronic control system, shown as control system 400, for an integrated electronic door (e.g., similar to the door system 300 of FIG. 3, etc.) is shown according to an exemplary embodiment. As shown in FIG. 4, the control system 400, a privacy window 420, a door lock 430, and a camera 440 are installed in a door slab 405 and connected by electrical wiring 412 through a flexible conduit or electric transfer hinge 415 to an external power source and/or to an optional internal power supply, shown as battery backup 495, positioned within the door slab 405. As shown in FIG. 4, a light source (e.g., a LED light strip, etc.), shown as lighting element 450, is installed in a jamb, shown as door jamb 407, (e.g., above the door slab 405, etc.) and is connected by electrical wiring 411 to an external power source, shown as building power source 408. The lighting element 450 and/or the camera 440 may be electrically connected with one or more sensors integrated into the door jamb 407 and/or the door slab 405 (e.g., motion sensors, vibration sensors, etc.) to activate the lighting element 450 and/or the camera 440 when activity at the door slab 405 is detected.

As shown in FIG. 4, the door lock 430, the camera 440, and the lighting element 450 are in wireless communication with a local Wi-Fi router, shown as router 497, for communication with a user interface I. As one example, the user interface I may be a voice controlled personal assistant (e.g., Amazon Echo® or the like) in wireless communication with the router 497, or a smartphone or other computing device C in communication with the router via cloud service communication (e.g., cloud service management by any one or more of the door manufacturer and/or the lock, camera, and/or lighting element provider). The privacy window 420 is in wireless communication (e.g., Bluetooth®, Wi-Fi, etc.) with a switch, shown as control switch 490, for local user control of the privacy window 420 and/or the lighting element 450.

Figure 5:
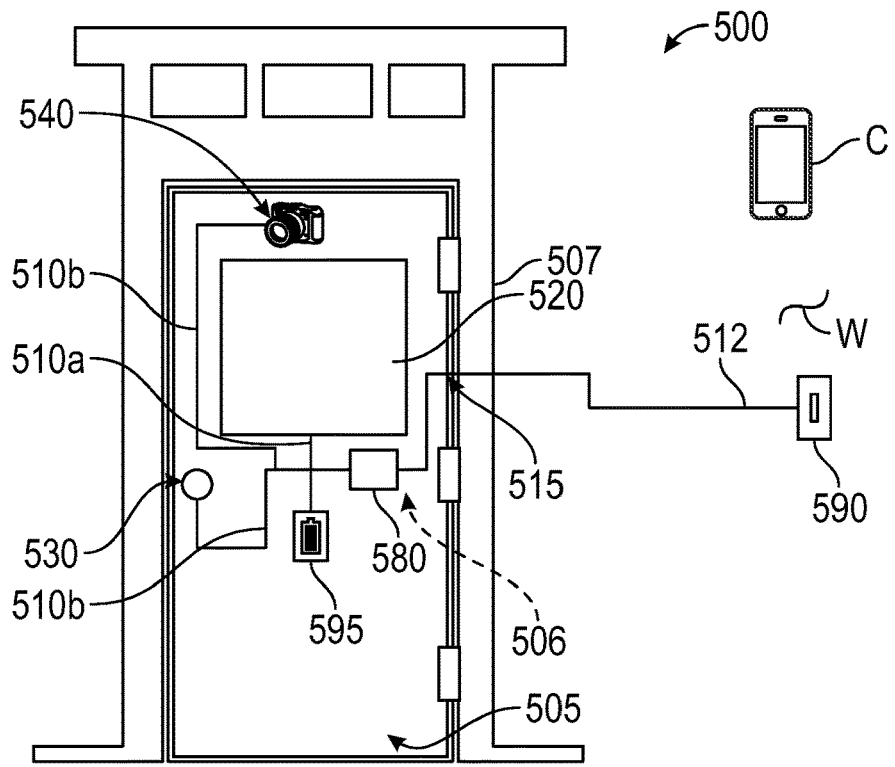
FIG. 5 is a schematic view of an integrated electronic door system with power supplied to the door slab through electrical wiring and a controller in the core, according to another exemplary embodiment.

In still other embodiments, an electronic door system may include an integrated controller (e.g., a control board, a control system, etc.) embedded in a composite door for integrated, single-source control of a plurality of electronic door features. As shown in FIG. 5, a door assembly, shown as door system 500, includes an electrically-operated window (e.g., a glass window, etc.), shown as privacy window 520, an electrically-operated locking mechanism, shown as door lock 530, and a security camera, shown as camera 540, connected by first wiring, shown as high voltage electrical wiring 510a, and second wiring, shown as low voltage electrical wiring 510b to a controller, shown as control board 580, respectively. The control board 580 is connected to (i) external wiring, shown as external electrical wiring 512, and (ii) the high voltage electrical wiring 510a and the low voltage electrical wiring 510b routed through an interior core (e.g., a foam core, etc.), shown as core 506, of the door slab 505 (installed either before or after foam installation, as discussed above) to an electric transfer hinge or flexible conduit 515 (as shown), and into a jamb, shown as door jamb 507, for connection with an external power source (e.g., a building power source, etc.). As shown in FIG. 5, the electrical wiring (e.g., the high voltage electrical wiring 510a, the low voltage electrical wiring 510b, the external electrical wiring 512, etc.) is connected (directly or indirectly) with a switch, shown as control switch 590, installed on an interior building wall W and connected with the building electrical system for user operation of one or more of the privacy window 520, the door lock 530, and the camera 540 (e.g., for specific control, for powering on/off, etc.). In other embodiments, the control switch 590 is additionally or alternatively disposed directly on a rear surface of the door slab 505. In still other embodiments, the control switch 590 is in wireless communication (e.g., RFID, Bluetooth®, infrared, Wi-Fi, etc.) with any of the electronic door features, for example, through communication with a transceiver connected with the corresponding electronic door feature.

The control board 580 may be provided with a wireless transceiver for wireless communication (e.g., Wi-Fi, cellular, Bluetooth, etc.) between any one or more of the installed electronic features and a smart phone or other computing device C (e.g., using a locally stored or web-based application). Additionally or alternatively, any one or more of the installed electronic features may be provided with their own control systems (e.g., an integrated controller, etc.) for remote user control of the electronic feature, for example, through wireless communication (e.g., Wi-Fi, cellular, Bluetooth, etc.) with a smart phone or other computing device C (e.g., using a locally stored or web-based application). Either or both of the door lock 530 and the camera 540 may be provided with backup battery units, for example, for powered operation of the door lock 530 and/or the camera 540 in the event of loss of power to the building. Additionally or alternatively, an internal power supply, shown as backup battery 595, may be integrated into the door slab 505 for connection with one or more of the electronic features of the door system 500 to supply backup power to the electronic features in the event of building power loss. In an exemplary embodiment, the backup battery 595 is configured to supply only low voltage power to the corresponding low voltage electronic devices (e.g., the door lock 530, the camera 540, etc.) without powering the high voltage electronic device(s) (e.g., the privacy window 520, etc.). The backup battery 595 may be a rechargeable battery connected with the building power supply and may be configured to recharge when power to the building is operational and/or restored.

Figure 6:
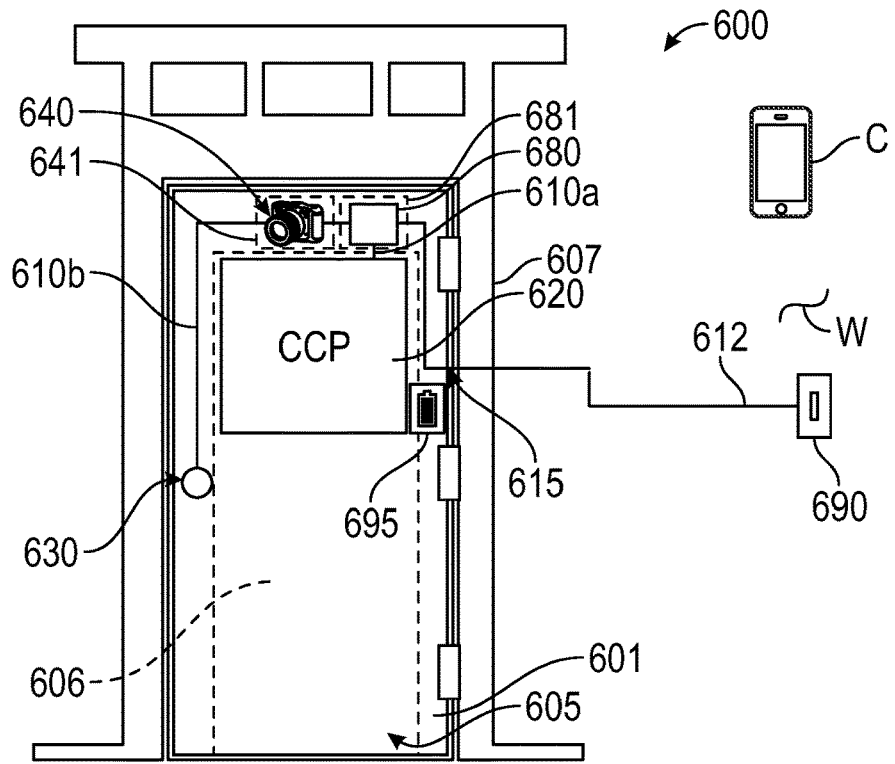
FIG. 6 is a schematic view of an integrated electronic door system with power supplied to the door slab through electrical wiring and a controller in the frame, according to another exemplary embodiment.

In other embodiments, a composite door may include electrical features and wiring embedded or otherwise disposed in an outer frame portion (e.g., the frame member 14, etc.) of the door such that a door may be assembled from a complete, electronics-integrated door frame member, for example, to reduce door assembly time. As shown in FIG. 6, a door assembly, shown as door system 600, includes an electrically-operated window (e.g., a glass window, etc.), shown as privacy window 620, an electrically-operated locking mechanism, shown as door lock 630, and a security camera, shown as camera 640, connected by first wiring, shown as high voltage electrical wiring 610a, and second wiring, shown as low voltage electrical wiring 610b, to a controller, shown as control board 680, respectively. The control board 680 is connected to (i) external wiring, shown as electrical wiring 612, and (ii) the high voltage electrical wiring 610a and the low voltage electrical wiring 610b routed through an interior core (e.g., a foam core, etc.), shown as core 606, of the door slab 605 (installed either before or after foam installation, as discussed above) to an electric transfer hinge or flexible conduit 615 (as shown), and into a jamb, shown as door jamb 607, for connection with an external power source (e.g., a building power source, etc.). The electrical wiring 610a, 610b, 612 is routed through channels in a door frame member (e.g., like the frame member 14; a through hole drilled or otherwise formed in the upper door rail, and the inner and outer door stiles; etc.), shown as frame 601. The camera 640 is retained in a first modular housing, shown as camera housing 641, received in a cavity in an upper edge of an upper door rail of the frame 601 with a lens of the camera 640 aligned with an aperture in the door slab 605 (e.g., an outer door skin thereof, etc.). The control board 680 is retained in a second modular housing, shown as a controller housing 681, received in the upper edge of the upper door rail of the frame 601. In other embodiments, the controller housing 681 is otherwise positioned within the frame 601 (e.g., received in the outer edge of one of the door stiles, etc.). The housing enclosures may protect the circuitry of the control board 680 and/or the camera 640, and their electrical wiring connections, from contact with the core 606 (e.g., which may be constructed from flammable material, etc.).

As shown in FIG. 6, the electrical wiring (e.g., the high voltage electrical wiring 510a, the low voltage electrical wiring 510b, the external electrical wiring 512, etc.) is connected (directly or indirectly) with a switch, shown as control switch 690, installed on an interior building wall W and connected with the building electrical system for user operation of one or more of the privacy window 620, the door lock 630, and the camera 640 (e.g., for specific control, for powering on/off, etc.). In other embodiments, the control switch 690 is additionally or alternatively disposed directly on a rear surface of the door slab 605. In still other embodiments, the control switch 690 is in wireless communication (e.g., RFID, Bluetooth®, infrared, Wi-Fi, etc.) with any of the electronic door features, for example, through communication with a transceiver connected with the corresponding electronic door feature.

The control board 680 may be provided with a wireless transceiver for wireless communication (e.g., Wi-Fi, cellular, Bluetooth, etc.) between any one or more of the installed electronic features and a smart phone or other computing device C (e.g., using a locally stored or web-based application). Additionally or alternatively, any one or more of the installed electronic features may be provided with their own control systems (e.g., an integrated controller, etc.) for remote user control of the electronic feature, for example, through wireless communication (e.g., Wi-Fi, cellular, Bluetooth, etc.) with a smart phone or other computing device C (e.g., using a locally stored or web-based application). Either or both of the door lock 630 and the camera 640 may be provided with backup battery units, for example, for powered operation of the door lock 630 and/or the camera 640 in the event of loss of power to the building. Additionally or alternatively, an internal power supply, shown as backup battery 695, may be integrated into the door slab 605 for connection with one or more of the electronic features of the door system 600 to supply backup power to the electronic features in the event of building power loss. In an exemplary embodiment, the backup battery 695 may be configured to supply only low voltage power to the corresponding low voltage electronic devices (e.g., the door lock 630, the camera 640, etc.) without powering the high voltage electronic device(s) (e.g., the privacy window 620). The backup battery 695 may be a rechargeable battery connected with the building power supply and may be configured to recharge when power to the building is operational and/or restored. Like the control board 680, the backup battery 695 may be enclosed in a third housing installed in the frame 601, for example, to facilitate installation, and/or to provide a fire safe enclosure for the backup battery 695 and its wiring connections.

Figure 7:
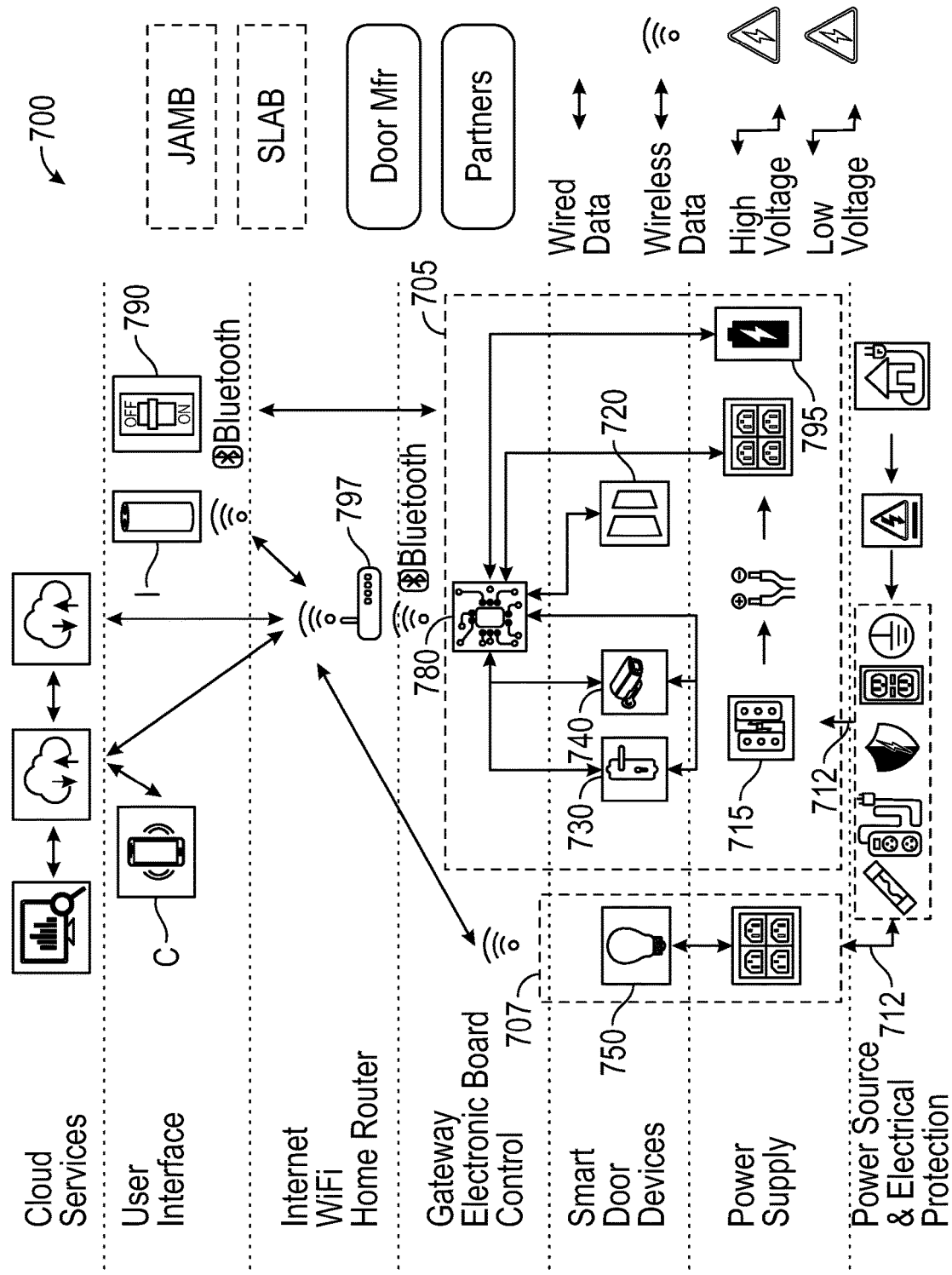
FIG. 7 is a schematic block diagram of an electronic control system for an integrated electronic control system having independently operable electronic features, according to an exemplary embodiment.

Referring now to FIG. 7, a schematic block diagram of an electronic control system, shown as control system 700, for an integrated electronic door (e.g., similar to the door system 600 of FIG. 6, etc.) is shown according to an exemplary embodiment. As shown in FIG. 7, the control system 700, a privacy window 720, a door lock 730, and a camera 740 are installed in a door slab 705 and connected by electrical wiring to a controller, shown as control board 780, which is connected by electric wiring 712 through an electric transfer hinge 715 to an external power source, and to an optional internal power supply, shown as backup battery 795, disposed within the door slab 705. As shown in FIG. 7, a light source (e.g., a LED light strip, etc.), shown as lighting element 750, is installed in a jamb, shown as door jamb 707, (e.g., above the door slab 705, etc.) and is connected by electrical wiring 711 to an external power source, shown as building power source 708.

The control board 780 is in wireless communication with a local Wi-Fi router, shown as router 797, for communication with a user interface I. As one example, the user interface I may be a voice controlled personal assistant (e.g., Amazon Echo® or the like) in wireless communication with the router 797, or a smartphone or other computing device C in communication with the router via cloud service communication (e.g., cloud service management by any one or more of the door manufacturer and/or the lock, camera, and/or lighting element provider). The privacy window 720 may be in wireless communication (e.g., Bluetooth®) with a wall mounted control switch 790 for local user control of the privacy window 720.

Electronic Door System

Figure 11:
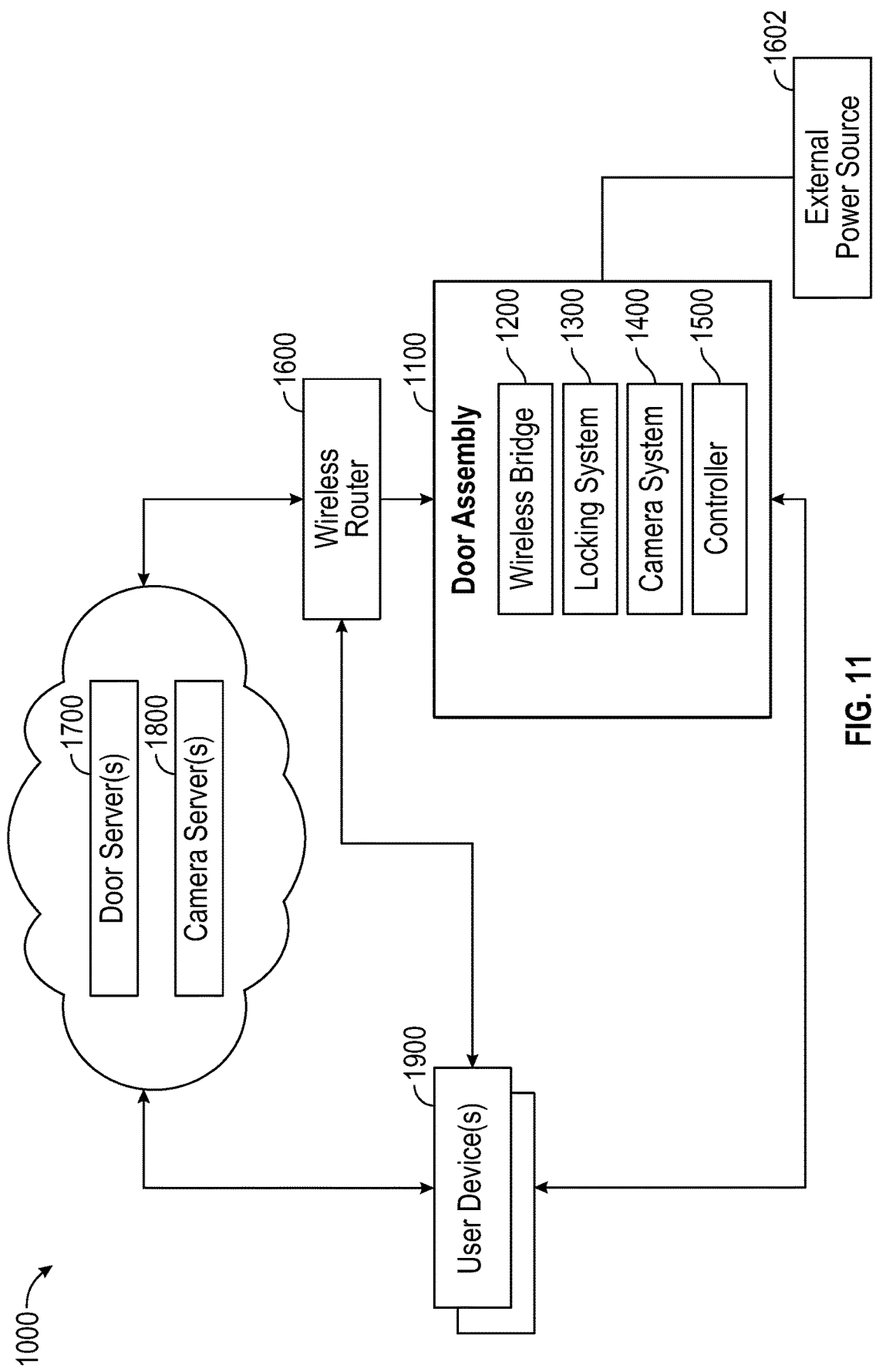
FIG. 11 is a schematic block diagram of an electronic door system, according to an exemplary embodiment.

According to the exemplary embodiment shown in FIG. 11, a door system (e.g., a smart door system, etc.), shown as electronic door system 1000, includes a door assembly, shown as electronic door assembly 1100, (i) electrically coupled to a first power source (e.g., a mains power supply, a building power system, etc.), shown as external power source 1602, and (ii) communicably coupled to (a) an intermediary device, shown as wireless router 1600, (b) one or more user devices (e.g., a smartphone, a mobile phone, a cell phone, a tablet, a laptop, a computer, a smartwatch, a smartcard, a keycard, etc.), shown as user devices 1900, directly and/or indirectly via the wireless router 1600, and (c) one or more remote servers, shown as door server 1700 and camera server 1800, via the wireless router 1600 and/or the user devices 1900. According to an exemplary embodiment, the door server 1700 and the camera server 1800 are independent servers (e.g., the functions performed by one server are not performed by the other server, etc.). In some embodiments, the door server 1700 and/or the camera server 1800 include a plurality of servers. In some embodiments, the door server 1700 and the camera server 1800 are a single server or a single plurality of servers (e.g., the functions of the door server 1700 and the camera server 1800 described herein may be performed by the same server(s), etc.).

As shown in FIG. 11, the electronic door assembly 1100 includes various electrically-operated components including a first electrically-operated component, shown as wireless bridge 1200, a second electrically-operated component, shown as locking system 1300, a third electrically-operated component, shown as camera system 1400, and a fourth electrically-operated component, shown as controller 1500. In some embodiments, the electronic door assembly 1100 does not include one or more of the wireless bridge 1200, the locking system 1300, the camera system 1400, and the controller 1500.

As shown in FIG. 11, the door server 1700 and/or the camera server 1800 are configured to communicate with the user devices 1900 (e.g., using a first communication protocol, using a long-range communication protocol, cellular, Internet, radio, etc.) and the user devices 1900 are configured to (i) communicate directly with one or more components of the electronic door assembly 1100 (e.g., using a second communication protocol, using a short-range communication protocol, Bluetooth, Bluetooth low energy ("BLE"), near-field communication ("NFC"), radio frequency identification ("RFID"), Wi-Fi, using a long-range communication protocol, cellular, etc.) and/or (ii) communicate indirectly with one or more components of the electronic door assembly 1100 (e.g., using a third communication protocol, Wi-Fi, BLE, etc.) through the wireless router 1600 and/or the wireless bridge 1200 (e.g., when within BLE range, when within range of the wireless router 1600, when within range of the wireless bridge 1200, etc.).

The user devices 1900 may thereby function as an intermediary device that facilitates data transmissions between (i) the door server 1700 and/or the camera server 1800 and (ii) one or more components of the electronic door assembly 1100 (e.g., one or more components of the electronic door assembly 1100 may be "disconnected devices" that do not communicate with the door server 1700 and/or the camera server 1800, etc.). In some embodiments, the user devices 1900 are configured to communicate with one or more components of the electronic door assembly 1100 through the door server 1700, the camera server 1800, the wireless router 1600, and/or the wireless bridge 1200 (e.g., when not within wireless range of the electronic door assembly 1100, etc.). In some embodiments, the camera server 1800 does not communicate directly with the user devices 1900. In such embodiments, the camera server 1800 may communicate with the user devices 1900 through the door server 1700 (e.g., the door server 1700 functions as an intermediary, etc.).

As shown in FIG. 11, the door server 1700 and/or the camera server 1800 are configured to communicate with the wireless router 1600 (e.g., using a long-range communication protocol, Internet, etc.) and the wireless router 1600 is configured to (i) communicate directly with one or more components of the electronic door assembly 1100 (e.g., using Wi-Fi, etc.) and/or (ii) communicate indirectly with one or more components of the electronic door assembly 1100 through the wireless bridge 1200 (e.g., using Wi-Fi, etc.). The wireless router 1600 may thereby function as an intermediary device that facilitates data transmissions between (i) the door server 1700 and/or the camera server 1800 and (ii) one or more components of the electronic door assembly 1100.

According to an exemplary embodiment, the door server 1700 is configured to manage a plurality of access credentials or user profiles for one or more users that have access to the locking system 1300, the camera system 1400, and/or the controller 1500 of the electronic door assembly 1100. In general, a user profile may include one or more files that include data related to operation of the locking system 1300, the camera system 1400, and/or the controller 1500. For example, the user profile may contain a user schedule of when an associated locking system 1300 may be accessed (unlocked, locked, etc.). The schedule may specify lock access permissions, e.g., by day of the week, including starting times (hours, minutes, etc.) and ending times (hours, minutes, etc.) for each corresponding permission. For example, a schedule may specify the time spans in which the associated locking system 1300 may be unlocked via the user device 1900 of the specific user associated with the user profile. As another example, the schedule may specify time periods in which typical interactions are expected to occur, and a level of trust may be determined based on these time periods. Accordingly, an unlock request sent within an expected time period may be more trusted by the associated locking system 1300 than a request sent at an unexpected/atypical time. In one embodiment, a default user schedule is set (e.g., by the manufacturer, etc.). Additionally, a list of typical user schedules may also be provided to allow a user to select from one of many configuration options. In this manner, a manufacturer may provide various recommended operational settings to a user. A user may also customize a schedule to tailor the schedule as he or she desires (e.g., an administrator, etc.).

A user profile may further specify a model/serial number of the associated locking system 1300 and what types of accesses are available for that user. For example, such accesses may include: reading software/hardware version information of the associated locking system 1300, updating software of the associated locking system 1300, reading a shackle/latch/dead-bolt state of the associated locking system 1300, locking, unlocking, disarming, reading/setting a time/clock value, reading a battery level, reading/clearing event related data (e.g., flags, counters, etc.), reading a log of the lock, reading/setting/resetting a keypad code of the associated locking system 1300, reading communications data for the associated locking system 1300 (e.g., transmission statuses, transmission power levels, channel information, addressing information, etc.), reading/setting default values stored for the associated locking system 1300 (e.g., default disarm times, default unlock times, etc.), among others. A user profile may also specify a start time and a revocation date/time for the user profile (i.e., when the user profile begins to be valid and when the user profile expires and is no longer valid). A user profile may provide maximum disarm/unlock times for the associated locking system 1300. A user profile may also provide an indication of a trust level of a corresponding user device 1900 (e.g., whether a time value/timestamp provided by the user device 1900 is trusted or not). The locking system 1300 may be configured to allow or disallow certain functionality based on the trust level of a respective user device 1900 requesting access thereto. The trust level may be stored as an independent permission that the user may or may not have access to (e.g., the trust level may be managed/adjusted by the software of the locking system 1300, the user device 1900, the door server 1700, etc.). As an example, only a highly trusted user device 1900 may be able to upgrade the firmware of a respective locking system 1300 or change certain settings.

Additionally, the locking system 1300 may have a security algorithm that factors in a trust level and time value. For example, as a respective user device 1900 successfully interacts with a respective locking system 1300 more often, the respective locking system 1300 may increase (or adjust) a trust level for the respective user device 1900. However, if a time value is out of sync with the maintained time of the respective locking system 1300 or authentication fails, the respective locking system 1300 may decrease (or adjust) a trust level for the respective user device 1900. The time value provided by the respective user device 1900 may be compared to a time value maintained by the respective locking system 1300, and a degree of closeness between the two times may be used to indicate a trust level for the respective user device 1900 (e.g., the closer the two times are to being in sync, the higher the trust level, etc.). If a trust level decreases below a certain threshold, the respective locking system 1300 may discontinue or limit interactions with the respective user device 1900. A trust level may also be based on the schedule discussed above. For example, a respective user device 1900 may be regarded as more or less trusted based on the time the respective user device 1900 is accessing a respective locking system 1300, and whether that time falls within certain time periods as defined by the schedule. The time value provided by the respective user device 1900 may also be used to sync the clock of a respective locking system 1300 with that of the respective user device 1900 or may be used otherwise during authenticated communications. Any of the user profile items discussed may have default values (e.g., manufacturer defaults) or user provided values (e.g., from a user with administrator permission access, etc.). A user profile is not limited to the above data, and additional data may be included or excluded.

According to an exemplary embodiment, the electronic door system 1000 implements an approach that provides for secure communication between the user device 1900 and the locking system 1300 using a two key authentication scheme, without both keys being stored on the locking system 1300 (e.g., during a manufacturing phase). In such an embodiment, (i) a first key or a device key is known/stored on the locking system 1300 and the door server 1700 that is unique to the locking system 1300 and (ii) a second key or a user key is known/stored on each of the user devices 1900 that is unique to each of the user devices 1900 or user profiles and not pre-stored on the locking system 1300. Each device key, each user key, and each user profile may be specific to a respective locking system 1300. In this manner, the device key, the user key, and the user profile may uniquely relate to a single locking system 1300. According to an exemplary embodiment, the door server 1700 is configured to encrypt each user profile with the device key of the locking system 1300 that the user profile is associated with. When attempting to access a locking system 1300, a user device 1900 may receive a device identifier from the locking system 1300 and compare the device identifier to a list of device identifiers associated with one or more encrypted user profiles currently loaded onto the user device 1900 (e.g., that were delivered according to a profile delivery protocol, etc.). If a match is found, the user device 1900 may transmit the associated encrypted user profile to the locking system 1300. The encrypted user profile includes the user key. The locking system 1300 may decrypt the encrypted user profile using the device key pre-stored thereon to obtain the user key. The user device 1900 may then generate and transmit an encrypted command to the locking system 1300. The encrypted command is encrypted using the user key. The locking system 1300 may then decrypt the encrypted command using the user key obtained from the decrypted user profile and initiate the action specified by the decrypted command (e.g., unlocking a physical locking component, implementing a firmware update, etc.). In some embodiments, the two key authentication process including the device key and the user key additionally includes a handshake nonce, a reply nonce, and/or a modified reply nonce, as described in more detail herein.

It should be understood that the two key authentication scheme described herein between the door server 1700, the user devices 1900, and the locking systems 1300 may similarly be applied between (i) the door server 1700, the user devices 1900, and the controller 1500, (ii) the door server 1700, the user devices 1900, and the camera system 1400, and/or (iii) the camera server 1800, the user devices 1900, and the camera system 1400.

Further, it should be understood that the two key authentication scheme described herein is not meant to be limiting, but is provided as an example of one possible way to provide secure communication between the door server 1700, the user devices 1900, and the locking systems 1300 of the electronic door system 1000. In other embodiments, secure communication is otherwise established using a different authentication scheme such as an authentication scheme that employs digital signatures, challenge-response procedures, multi-factor authentication (e.g., two-factor authentication, user profile plus a biometric, a user profile plus a PIN, etc.), and/or still other suitable authentication schemes. Further, such a two-key authentication scheme may or may not be used in implementations where a component of the electronic door assembly 1100 is in direct communication with the door server 1700 and/or the camera server 1800 (i.e., the communication is routed through the wireless router 1600, not the user devices 1900).

Electronic Door Assembly

Figure 12:
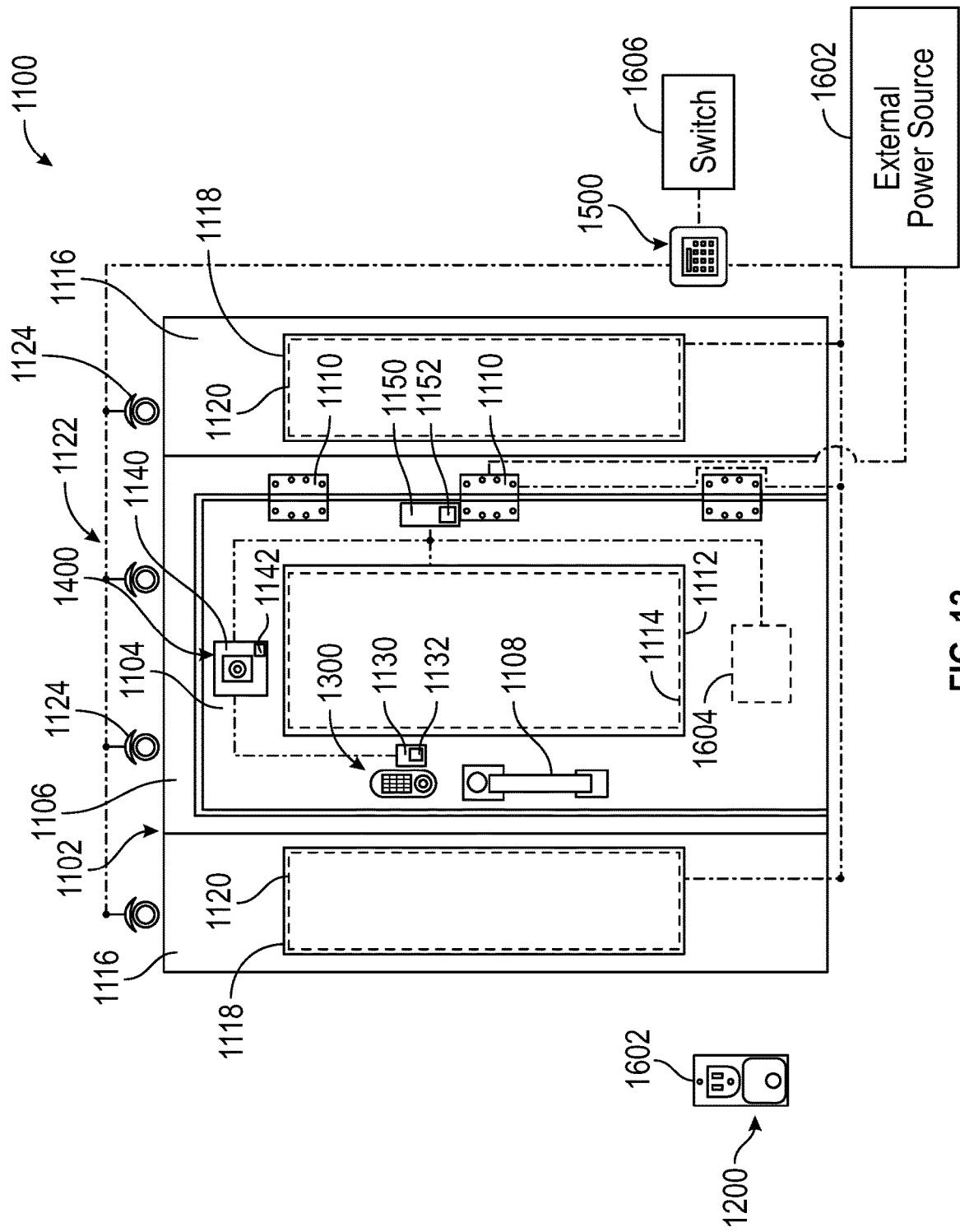
FIG. 12 is a schematic diagram of a door assembly of the electronic door system of FIG. 11, according to an exemplary embodiment.
Figure 13:
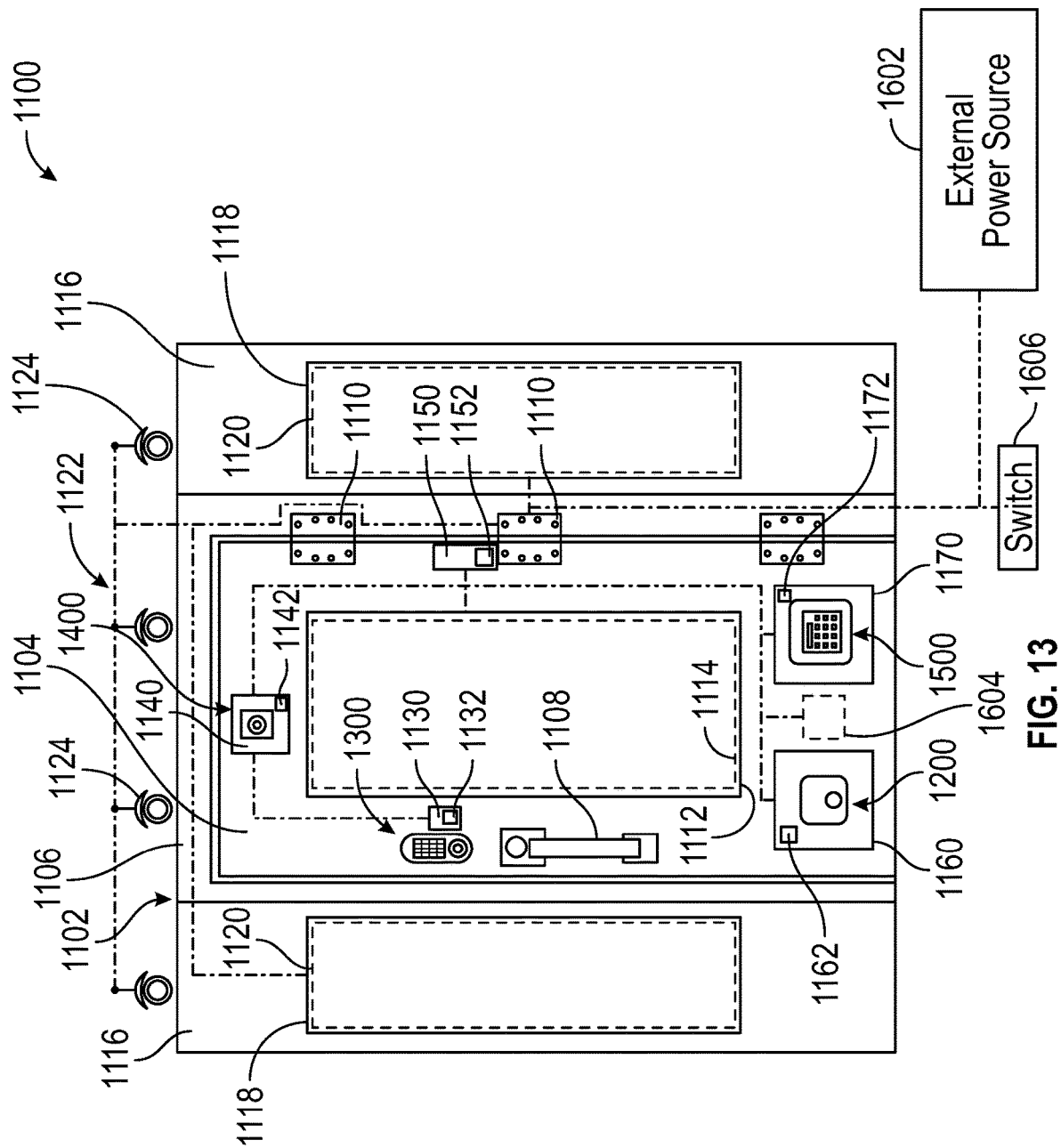
FIG. 13 is a schematic diagram of a door assembly of the electronic door system of FIG. 11, according to another exemplary embodiment.

As shown in FIGS. 12 and 13, the electronic door assembly 1100 includes a door, shown as door 1102, having a slab (e.g., a solid slab, a composite slab, etc.), shown as door slab 1104; a jamb, shown as door jamb 1106; a knob, shown as door knob 1108, configured to facilitate opening the door 1102; and one or more hinges, shown as hinges 1110, pivotally coupling a hinged edge of the door slab 1104 to the door jamb 1106. According to the exemplary embodiment shown in FIGS. 12 and 13, one of the hinges 1110 is an electric transfer hinge that facilitates connecting one or more electrically-operated door components of the electronic door assembly 1100 (e.g., the wireless bridge 1200, the locking system 1300, the camera system 1400, the controller 1500, etc.) to the external power source 1602. In other embodiments, all of the hinges 1110 are standard mechanical hinges and the electrically-operated door components are otherwise coupled to the external power source 1602 (e.g., via an electrical conduit, etc.).

As shown in FIGS. 12 and 13, the door 1102 includes a first transparent panel, shown as window 1112, embedded within the door slab 1104. The window 1112 includes a privacy element, shown as blocker 1114, embedded therein or integrated therewith. In some embodiments, the blocker 1114 is or includes electrically-controllable shades/blinds disposed within the window 1112 or disposed along an interior side of the window 1112. In some embodiments, the blocker 1114 is additionally or alternatively integrated into or disposed along the window 1112 such that the window 1112 has an electrically-controllable opacity (e.g., an electrically-controllable coating, an electrically-controllable film, etc.). In some embodiments, the door 1102 does not include the window 1112 or the window 1112 does not include the blocker 1114.

As shown in FIGS. 12 and 13, the door 1102 includes side panels, shown as panels 1116, disposed along the right side and the left side of the door jamb 1106. In other embodiments, the door 1102 includes only one of the panels 1116 along the right side of the door jamb 1106 or the left side of the door jamb 1106. In still other embodiments, the door 1102 does not include the panels 1116. As shown in FIGS. 12 and 13, each of the panels 1116 includes a second transparent panel, shown as window 1118, embedded within the panels 1116. The windows 1118 include privacy elements, shown as blockers 1120, embedded therein or integrated therewith. In some embodiments, the blockers 1120 are or include electrically-controllable shades/blinds disposed within the windows 1118 or disposed along an interior side of the windows 1118. In some embodiments, the blockers 1120 are additionally or alternatively integrated into or disposed along the windows 1118 such that the windows 1118 have an electrically-controllable opacity (e.g., an electrically-controllable coating, an electrically-controllable film, etc.). In some embodiments, the blockers 1120 are the same as the blocker 1114. In some embodiments, the blockers 1120 are different than the blocker 1114. In some embodiments, the panels 1116 do not include the windows 1118 or the windows 1118 do not include the blockers 1120.

As shown in FIGS. 12 and 13, the electronic door assembly 1100 includes a light source, shown as lighting system 1122, including one or more lighting elements, shown as lights 1124. In some embodiments, the lights 1124 are separate from the door 1102 and configured to be disposed along an exterior surface of a building proximate the door 1102. In some embodiments, the lights 1124 are integrated into the door 1102 (e.g., the door slab 1104, the door jamb 1106, the panels 1116, etc.). In some embodiments, the lights 1124 are selectively/releasably coupled to the door 1102 (e.g., the door 1102 includes one or more light sockets that may be selectively accessed, etc.). In some embodiments, the electronic door assembly 1100 does not include the lighting system 1122.

As shown in FIGS. 12 and 13, one or more of the wireless bridge 1200, the locking system 1300, the camera system 1400, and the controller 1500 are integrated into the door 1102. In some embodiments, one or more of the wireless bridge 1200, the locking system 1300, the camera system 1400, and the controller 1500 are integrated into the door 1102 at the time of manufacture. In other embodiments, one or more of the wireless bridge 1200, the locking system 1300, the camera system 1400, and the controller 1500 are integrated into the door 1102 post-manufacture (e.g., by a retailer, by a contractor, by the end consumer, etc.). In some embodiments, one or more of the wireless bridge 1200, the locking system 1300, the camera system 1400, and the controller 1500 are separate from the door 1102 or coupled to an exterior thereof.

According to an exemplary embodiment, the electronic door assembly 1100 is a modular door assembly. As shown in FIGS. 12 and 13, the door slab 1104 includes a first selectively-accessible connection box, shown as locking system connection box 1130, embedded in the door slab 1104. In other embodiments, the locking system connection box 1130 is embedded in the door jamb 1106 and/or the panels 1116. In some embodiments, the locking system connection box 1130 includes a door or cover that facilitates selectively accessing an interior of the locking system connection box 1130. As shown in FIGS. 12 and 13, the locking system connection box 1130 includes a first interface (e.g., an electrical connector, etc.), shown as locking system interface 1132, disposed within the interior of the locking system connection box 1130 and configured to selectively interface with a first connector of the locking system 1300. Accordingly, the door 1102 can be manufactured and sold without the locking system 1300 and then the end user can select and install a locking system of their choosing (whether electrically-operated or mechanically-operated). In other embodiments, the locking system 1300 is provided with and/or hardwired into the door 1102.

As shown in FIGS. 12 and 13, the door slab 1104 includes a second selectively-accessible connection box, shown as camera system connection box 1140, embedded in the door slab 1104. In other embodiments, the camera system connection box 1140 is embedded in the door jamb 1106 and/or the panels 1116. In some embodiments, the camera system connection box 1140 includes a door or cover that facilitates selectively accessing an interior of the camera system connection box 1140. As shown in FIGS. 12 and 13, the camera system connection box 1140 is configured to selectively receive and hold the camera system 1400. In some embodiments, the door or cover of the camera system connection box 1140 is replaced with a door or cover that defines an aperture when the camera system 1400 is installed in the door 1102 (e.g., such that a camera lens of the camera system 1400 can see outside of the camera system connection box 1140, etc.). As shown in FIGS. 12 and 13, the camera system connection box 1140 includes a second interface (e.g., an electrical connector, etc.), shown as camera system interface 1142, disposed within the interior of the camera system connection box 1140 and configured to selectively interface with a second connector of the camera system 1400. Accordingly, the door 1102 can be manufactured and sold without the camera system 1400 and then the end user can select and install a camera system of their choosing. In other embodiments, the camera system 1400 is provided with and/or hardwired into the door 1102.

As shown in FIGS. 12 and 13, the door slab 1104 includes a third selectively-accessible connection box, shown as hinge connection box 1150, embedded in the door slab 1104. In some embodiments, the hinge connection box 1150 includes a door or cover that facilitates selectively accessing an interior of the hinge connection box 1150. As shown in FIGS. 12 and 13, the hinge connection box 1150 includes a third interface (e.g., an electrical connector, etc.), shown as hinge interface 1152, disposed within the interior of the hinge connection box 1150 and configured to selectively interface with a third connector of one of the hinges 1110. Accordingly, the door 1102 can be manufactured and sold without an electric transfer hinge and then the end user can select and install an electric transfer hinge as desired. In other embodiments, one of the hinges 1110 is an electric transfer hinge and is provided with and/or hardwired into the door 1102.

As shown in FIGS. 12 and 13, the locking system connection box 1130 and the camera system connection box 1140 are electrically coupled to the hinge connection box 1150 (e.g., hardwired, connected during manufacturing, etc.) and the hinge 1110 is configured to be electrically connected to the external power source 1602. The hinge 1110 may therefore facilitate powering the locking system 1300 and the camera system 1400 with the external power source 1602. As shown in FIGS. 12 and 13, the window 1112 is electrically connected to the hinge connection box 1150. In other embodiments, the window 1112 is electrically connected directly to the hinge 1110. The hinge 1110 may therefore facilitate powering the blocker 1114 of the window 1112 with the external power source 1602. As shown in FIGS. 12 and 13, the windows 1118 are electrically connected directly to the hinge 1110. In other embodiments, the windows 1118 are electrically connected to the hinge connection box 1150. The hinge 1110 may therefore facilitate powering the blockers 1120 of the window 1118 with the external power source 1602. As shown in FIGS. 12 and 13, the lighting system 1122 is electrically connected directly to the hinge 1110. In other embodiments, the lighting system 1122 is electrically connected to the hinge connection box 1150. The hinge 1110 may therefore facilitate powering the lighting system 1122 with the external power source 1602. In still other embodiments, the lighting system 1122 is directly connected to the external power source 1602.

As shown in FIG. 12, the wireless bridge 1200 is separate from the door 1102 and connected to the external power source 1602 (e.g., a wall outlet proximate the door 1102, etc.). As shown in FIG. 13, the wireless bridge 1200 is disposed within the door 1102 and connected to the external power source 1602 through the hinge connection box 1150 and/or the hinge 1110. As shown in FIG. 13, the door slab 1104 includes a fourth selectively-accessible connection box, shown as wireless bridge connection box 1160, embedded in the door slab 1104 and connected to the hinge connection box 1150. In other embodiments, the wireless bridge connection box 1160 is embedded in the door jamb 1106 and/or the panels 1116. In some embodiments, the wireless bridge connection box 1160 includes a door or cover that facilitates selectively accessing an interior of the wireless bridge connection box 1160. As shown in FIG. 13, the wireless bridge connection box 1160 is configured to selectively receive and hold the wireless bridge 1200. The wireless bridge connection box 1160 includes a fourth interface (e.g., an electrical connector, etc.), shown as wireless bridge interface 1162, disposed within the interior of the wireless bridge connection box 1160 and configured to selectively interface with a fourth connector of the wireless bridge 1200. Accordingly, the door 1102 can be manufactured and sold without the wireless bridge 1200 and then the end user can select and install a wireless bridge of their choosing. In other embodiments, the wireless bridge 1200 is provided with and/or hardwired into the door 1102. In still other embodiments, the electronic door assembly 1100 does not include the wireless bridge 1200. In such embodiments, the locking system 1300, the camera system 1400, and/or the controller 1500 may have the functionality of the wireless bridge 1200, as described in more detail herein.

As shown in FIG. 12, the controller 1500 is separate from the door 1102 and connected to the blocker 1114, the blockers 1120, and the lighting system 1122 to facilitate controlling the operation thereof with the controller 1500. According to the exemplary embodiment shown in FIG. 12, the controller 1500 is coupled to the external power source 1602 via the hinge 1110 and/or the hinge connection box 1150. In other embodiments, the controller 1500 is directly coupled to the external power source 1602. In some embodiments, the controller 1500 is additionally or alternatively connected to the locking system 1300 and/or the camera system 1400 to facilitate controlling the operation thereof with the controller 1500.

As shown in FIG. 13, the controller 1500 is disposed within the door 1102 and connected to the external power source 1602 through the hinge connection box 1150 and/or the hinge 1110. As shown in FIG. 13, the door slab 1104 includes a fifth selectively-accessible connection box, shown as controller connection box 1170, embedded in the door slab 1104 and connected to the hinge connection box 1150. In other embodiments, the controller connection box 1170 is embedded in the door jamb 1106 and/or the panels 1116. In some embodiments, the controller connection box 1170 includes a door or cover that facilitates selectively accessing an interior of the controller connection box 1170. As shown in FIG. 13, the controller connection box 1170 is configured to selectively receive and hold the controller 1500. The controller connection box 1170 includes a fifth interface (e.g., an electrical connector, etc.), shown as controller interface 1172, disposed within the interior of the controller connection box 1170 and configured to selectively interface with a fifth connector of the controller 1500. Accordingly, the door 1102 can be manufactured and sold without the controller 1500 and then the end user can select and install a controller 1500 at the time of their choosing. In other embodiments, the controller 1500 is provided with and/or hardwired into the door 1102. In still other embodiments, the electronic door assembly 1100 does not include the controller 1500. In such embodiments, the locking system 1300 and/or the camera system 1400 may have the functionality of the controller 1500.

As shown in FIGS. 12 and 13, the controller 1500 is connected to a user interface, shown as switch 1606. According to an exemplary embodiment, the switch 1606 is configured to facilitate selectively activating the blocker 1114, the blockers 1120, and/or the lighting system 1122. In some embodiments, the switch 1606 is configured to be installed in a wall proximate the door 1102. In some embodiments, the switch 1606 is configured to be installed along the door slab 1104 and/or the panels 1116 (e.g., along an interior surface thereof, etc.). In some embodiments, the switch 1606 is wirelessly connected to the controller 1500. In some embodiments, the switch 1606 is connected to the controller 1500 via a wired connection. In some embodiments, the controller 1500 is embedded within the switch 1606.

As shown in FIGS. 12 and 13, the door 1102 includes a secondary power source, shown as internal energy storage 1604, disposed within the door slab 1104. In some embodiments, the internal energy storage 1604 is additionally or alternatively disposed within the door jamb 1106 and/or the panels 1116. In some embodiments, the internal energy storage 1604 is removable. According to an exemplary embodiment, the internal energy storage 1604 is configured to provide power to one or more components of the door 1102 (e.g., the wireless bridge 1200, the locking system 1300, the camera system 1400, the controller 1500, the lighting system 1122, etc.) in the event that the external power source 1602 stops powering the components of the electronic door assembly 1100 (e.g., in the event of a power outage, etc.). In some embodiments, the door 1102 does not include the internal energy storage 1604.

In some embodiments, the electronic door assembly 1100 is voice activation capable. The electronic door assembly 1100 may be configured to accept various voice commands to the control the locking system 1300, the camera system 1400, the window 1112, the windows 1118, and/or the lighting system 1122. By way of example, the voice commands may include a command to lock or unlock a locking mechanism of the locking system 1300. By way of another example, the voice command may include a command to activate or deactivate a camera device of the camera system 1400. By way of yet another example, the voice command may include a command to activate or deactivate the window 1112 and/or the windows 1118. By way of still another example, the voice command may include a command to turn on or turn off the lights 1124 of the lighting system 1122.

In one implementation, the electronic door assembly 1100 may include a microphone within the door 1102, the locking system 1300, the camera system 1400, and/or the controller 1500. For example, the microphone of the electronic door assembly 1100 may be configured to acquire sound data indicative of a voice command. A component of the electronic door assembly 1100 (e.g., a processing circuit of the locking system 1300, the camera system 1400, the controller 1500, etc.) may be configured to analyze the sound data to determine the voice command. In some implementations, the component of the electronic door assembly 1100 may be configured to perform a voice authentication process to determine whether the person is permitted to provide voice commands to the electronic door assembly 1100. The component of the electronic door assembly 1100 may then provide the received voice command to an appropriate component of the electronic door assembly 1100 (e.g., the locking system 1300, the camera system 1400, the controller 1500, etc.) to take action (e.g., lock, unlock, activate, deactivate, turn on, turn off, etc.).

In another implementation, the electronic door assembly 1100 may be connectable to an external device that has a microphone such as (i) a smart hub device or a portable smart device (e.g., a smartphone, a smartwatch, a tablet, etc.) having a digital personal assistant (e.g., Amazon Alexa, Google Assistant, Microsoft Cortana, etc.) or (ii) the switch 1606. For example, a microphone of the external device may be configured to acquire sound data indicative of a voice command. The external device (e.g., a processing circuit thereof, etc.) may be configured to analyze the sound data to determine the voice command. In some implementations, the external device may be configured to perform a voice authentication process to determine whether the person is permitted to provide voice commands to the electronic door assembly 1100. The external device may then provide the received voice command to an appropriate component of the electronic door assembly 1100 (e.g., the locking system 1300, the camera system 1400, the controller 1500, etc.) to take action (e.g., lock, unlock, activate, deactivate, turn on, turn off, etc.). As another example, a microphone of the external device may be configured to acquire sound data indicative of a voice command and then the external device may transmit the sound data to a component of the electronic door assembly 1100 for further processing as described above.

Wireless Bridge

In general, the wireless bridge 1200 is configured to receive a first wireless signal in a first communication protocol and convert the first signal to a second wireless signal in a second communication protocol, and vice versa. As shown in FIG. 14, the wireless bridge 1200 includes a processing circuit 1202, a first transceiver 1222, and a second transceiver 1224. In some embodiments, the wireless bridge 1200 includes a door connector 1226 configured to interface with the wireless bridge interface 1162. In some embodiments, the wireless bridge 1200 includes an outlet connector 1228 (e.g., a wall plug, etc.) configured to interface directly with the external power source 1602 (e.g., a wall outlet, etc.). In some embodiments, the wireless bridge 1200 does not include the door connector 1226 or the outlet connector 1228. In such embodiments, the wireless bridge 1200 may be hardwired within the door 1102.

As shown in FIG. 14, the processing circuit 1202 has a processor 1204 and a memory 1206. The processing circuit 1202 may include a general-purpose processor, an ASIC, one or more FPGAs, a DSP, circuits containing one or more processing components, circuitry for supporting a microprocessor, a group of processing components, or other suitable electronic processing components. In some embodiments, the processor 1204 is configured to execute computer code stored in the memory 1206 to facilitate the activities described herein. The memory 1206 may be any volatile or non-volatile computer-readable storage medium capable of storing data or computer code relating to the activities described herein. According to an exemplary embodiment, the memory 1206 includes computer code modules (e.g., executable code, object code, source code, script code, machine code, etc.) configured for execution by the processor 1204.

According to an exemplary embodiment, the first transceiver 1222 is configured to receive and transmit wireless signals using a first wireless communication protocol. By way of example, the first wireless communication protocol may be a short-range communication protocol. In one embodiment, the first transceiver 1222 includes Bluetooth components for establishing a Bluetooth connection with a Bluetooth enabled device (e.g., the user devices 1900, the locking system 1300, the controller 1500, etc.). According to an exemplary embodiment, the second transceiver 1224 is configured to receive and transmit wireless signals using a second wireless communication protocol. By way of example, the second wireless communication protocol may be a short-range communication protocol. In one embodiment, the second transceiver 1224 includes Wi-Fi components for establishing a Wi-Fi connection with a Wi-Fi enabled device (e.g., the user devices 1900, the locking system 1300, the controller 1500, the wireless router 1600, etc.). In another embodiment, the first transceiver 1222 and/or the second transceiver 1224 include different types of components that facilitate a different type of short-range wireless communication protocol (e.g., radiofrequency, RFID, ZigBee, NFC, etc.). In other embodiments, the first transceiver 1222 and/or the second transceiver 1224 include components that facilitate a long-range wireless communication protocol (e.g., cellular, etc.)

As shown in FIG. 14, the memory 1206 of the wireless bridge 1200 includes a bridge circuit 1208. The bridge circuit 1208 may be configured to convert a first wireless signal received by the first transceiver 1222 in a first wireless communication protocol (e.g., BLE, cellular, etc.) to a second wireless signal in a second communication protocol (e.g., Wi-Fi, BLE, etc.) to be emitted by the second transceiver 1224. The bridge circuit 1208 may be also configured to convert the second wireless signal received by the second transceiver 1224 in the second wireless communication protocol to the first wireless signal in the first communication protocol to be emitted by the first transceiver 1222.

As shown in FIG. 14, the bridge circuit 1208 includes a device circuit 1210, a profile management circuit 1212, and a communication circuit 1214. The device circuit 1210 is configured to acquire a device identifier from devices proximate the wireless bridge 1200 (e.g., based on an identifier broadcasted by a respective locking system 1300, a respective controller 1500, a respective camera system 1400, etc.). The profile management circuit 1212 is configured to receive and store encrypted bridge profiles and bridge keys sent to the wireless bridge 1200 by the door server 1700, as described in more detail herein.

The communication circuit 1214 is configured to generate and transmit an encrypted command to a respective component of a respective electronic door assembly 1100. The encrypted command may include a command for the respective locking system 1300, the respective camera system 1400, and/or the respective controller 1500 to initiate a communication session with the wireless bridge 1200. According to an exemplary embodiment, the command is encrypted using the bridge key associated with the bridge profile that was transmitted to a component of the respective electronic door assembly 1100 at the start of the communication session. In some embodiments, the communication circuit 1214 is configured to generate a modified reply nonce based on a reply nonce received from the component of the respective electronic door assembly 1100 as described in more detail herein (e.g., in response to the component of the respective electronic door assembly 1100 successfully decrypting the encrypted bridge profile, etc.). In such embodiments, the communication circuit 1214 is configured to encrypt the command using both the bridge key and the modified reply nonce.

Locking System

In general, the locking system 1300 is configured to receive an encrypted user profile from a respective user device 1900 or the door server 1700 (e.g., directly, indirectly through the wireless bridge 1200, indirectly through the wireless router 1600, etc.) and make an access and/or a management control decision based on the encrypted user profile (e.g., whether to permit unlocking, updating, etc. by the respective user device 1900). In some embodiments, the locking system 1300 is or includes an electronic door lock such as an electrically operated deadbolt. In some embodiments, the locking system 1300 is or includes an electric strike. In some embodiments, the locking system 1300 is or includes a magnetically operated locking mechanism (e.g., an electromagnetic locking mechanism, etc.). In some embodiments, the locking system 1300 is or includes a mortise locking mechanism. In some embodiments, the locking system 1300 is or includes a multi-point lockset. In some embodiments, the locking system 1300 includes two or more of the above in combination. In some embodiments (e.g., embodiments where the electronic door assembly 1100 does not include the controller 1500, etc.), the functions of the controller 1500 described herein may be performed by the locking system 1300. In some embodiments, the functions of the locking system 1300 described herein may be performed by the controller 1500. In some embodiments, operation of the locking system 1300 is controllable independent of the controller 1500 (e.g., the controller 1500 and the locking system 1300 perform independent authentication processes, etc.).

As shown in FIG. 15, the locking system 1300 includes a processing circuit 1302, a first transceiver 1322, a second transceiver 1324, a door connector 1326, a user interface 1328, a lock mechanism 1330, and a battery 1332. In some embodiments, the locking system 1300 does not include the second transceiver 1324, the door connector 1326, and/or the battery 1332. The processing circuit 1302 has a processor 1304, a memory 1306, and a timer 1320. The processing circuit 1302 may include a general-purpose processor, an ASIC, one or more FPGAs, a DSP, circuits containing one or more processing components, circuitry for supporting a microprocessor, a group of processing components, or other suitable electronic processing components. In some embodiments, the processor 1304 is configured to execute computer code stored in the memory 1306 to facilitate the activities described herein. The memory 1306 may be any volatile or non-volatile computer-readable storage medium capable of storing data or computer code relating to the activities described herein. According to an exemplary embodiment, the memory 1306 includes computer code modules (e.g., executable code, object code, source code, script code, machine code, etc.) configured for execution by the processor 1304. The timer 1320 is configured to maintain a time value for the locking system 1300. For example, the timer 1320 may be the clock of the processor 1304 or may be any other time keeping circuit of the locking system 1300. The time value maintained by the timer 1320 may be used in secured communications (e.g., in syncing time with the user devices 1900, in providing timestamps related to events for logging purposes, etc.).

According to an exemplary embodiment, the first transceiver 1322 is configured to facilitate wireless communication using a first communication protocol. By way of example, the first communication protocol may be a short-range communication protocol. In one embodiment, the first transceiver 1322 includes Bluetooth components for establishing a Bluetooth connection with the user devices 1900, the wireless bridge 1200, the camera system 1400, and/or the controller 1500. In another embodiment, the first transceiver 1322 includes a different type of components that facilitate a different type of short-range and/or wireless communication protocol (e.g., radiofrequency, RFID, Zig-Bee, Wi-Fi, NFC, etc.). In embodiments where the locking system 1300 includes the second transceiver 1324, the second transceiver 1324 is configured to facilitate wireless communication using a second communication protocol. In one embodiment, the second transceiver 1324 includes wired or wireless (e.g., Wi-Fi) components for communicating with Internet connected devices (e.g., the camera system 1400, the controller 1500, the wireless router 1600, the user devices 1900, the door server 1700, the camera server 1800, etc.). In another embodiment, the second transceiver 1324 includes cellular components for communicating with the door server 1700, the camera server 1800, and/or the user devices 1900 via a cellular network.

In embodiments where the locking system 1300 includes the door connector 1326, the door connector 1326 is configured to selectively interface with the locking system interface 1132. In embodiments where the locking system 1300 does not include the door connector 1326, the locking system 1300 may be hardwired within the door 1102.

The user interface 1328 may include a display screen and/or one or more user input devices (e.g., touch screens, buttons, microphones, speakers, displays, a keypad, a directional pad, etc.) to allow a user to interact with the locking system 1300. By way of an example, the user interface 1328 may facilitate waking the locking system 1300 from a sleep mode. By way of another example, the user interface 1328 may facilitate manually entering an unlock combination.

The lock mechanism 1330 may include one or more physical and/or electronic locking mechanisms (e.g., pins, shackles, dials, buttons, shafts, keyholes, motors, latches, deadbolts, etc.). In embodiments that include the battery 1332, the battery 1332 is configured to provide power to the locking system 1300 to facilitate the operation thereof (e.g., locking, unlocking, etc.). The battery 1332 may be rechargeable and/or replaceable. Such a battery operated locking system 1300 may therefore operate in the event of power loss to the building in which the electronic door assembly 1100 is installed. In embodiments that do not include the battery 1332, the locking system 1300 may couple to another power source to facilitate the operation thereof (e.g., the external power source 1602, the internal energy storage 1604, etc.). In some embodiments, the locking system 1300 includes an input/output port (e.g., a USB port, a COM port, a networking port, etc.) that may be used to establish a physical connection to another device. For example, such a physical connection may be used by a manufacturer or installer to program or otherwise communicate with the locking system 1300.

According to an exemplary embodiment, the memory 1306 of the locking system 1300 includes various modules or circuits configured to make access control decisions. As shown in FIG. 15, the memory 1306 of the locking system 1300 includes a user input circuit 1308, an access control circuit 1310, and a bridge circuit 1312. In some embodiments, the memory 1306 does not include the bridge circuit 1312 (e.g., in embodiments where the electronic door assembly 1100 includes the wireless bridge 1200, in embodiments where the camera system 1400 or the controller 1500 function as a wireless bridge, etc.).

The user input circuit 1308 is configured to receive inputs through the user interface 1328. By way of example, the user input circuit 1308 may receive an input to awaken the locking system 1300 from a sleep mode. By way of another example, the user input circuit 1308 may receive a manual access code to unlock or otherwise access the locking system 1300. By way of another example, the user input circuit 1308 may receive an encrypted user profile and/or an encrypted command from a respective user device 1900 (e.g., directly, indirectly, etc.). By way of yet another example, the user input circuit 1308 may receive an updated or new device key from the door server 1700 (e.g., through the user device 1900 and/or the wireless bridge 1200, through the wireless router 1600 and/or the wireless bridge 1200, etc.).

The access control circuit 1310 is configured to store a device identifier, a device key, and/or a manual access code for the locking system 1300. The access control circuit 1310 may be configured to broadcast the device identifier via the first transceiver 1322 (e.g., in response to being awoken from a sleep mode, etc.). In response to the broadcast or in response to a user selecting the electronic door assembly 1100 associated with the locking system 1300 in an app, the locking system 1300 may receive an associated encrypted user profile from a respective user device 1900 or the door server 1700. The access control circuit 1310 is configured to decrypt the encrypted user profile using (i) the device key pre-stored thereon and/or (ii) a handshake nonce appended to the encrypted user profile (in embodiments where the handshake nonce is used) to obtain a user key from the decrypted user profile. In some embodiments, the access control circuit 1310 is configured to generate and transmit a reply nonce to the respective user device 1900 or the door server 1700 via the first transceiver 1322 or the second transceiver 1324 (e.g., depending on the proximity of the user device 1900 to the locking system 1300, depending on whether the locking system 1300 only includes the first transceiver 1322, etc.) in response to successfully decrypting the encrypted user profile.

The access control circuit 1310 may receive an encrypted command from the respective user device 1900 or the door server 1700 (e.g., after successfully decrypting the encrypted user profile, etc.) via the first transceiver 1322 or the second transceiver 1324 (e.g., depending on the proximity of the user device 1900 to the locking system 1300, depending on whether the locking system 1300 only includes the first transceiver 1322, etc.). The access control circuit 1310 is configured to decrypt the encrypted command using the user key obtained from the decrypted user profile. In some embodiments, the access control circuit 1310 is configured to generate a modified reply nonce based on the reply nonce to decrypt the encrypted command along with the user key (in embodiments where the access control circuit 1310 generates and transmits the reply nonce to the user device 1900 or the door server 1700 and the user device 1900 or the door server 1700 generates and encrypts the command with the user key and the modified reply nonce). The access control circuit 1310 is configured to initiate an action specified by the decrypted command (e.g., unlocking a physical locking component, implementing a firmware update, etc.) in response to successfully decrypting the encrypted command. A similar procedure may be performed between the wireless bridge 1200 and the access control circuit 1310 based on an encrypted bridge profile and encrypted command received from the wireless bridge 1200, as described in more detail herein. The access control circuit 1310 is configured to initiate a communication session between the locking system 1300 and the wireless bridge 1200 following such a successful procedure.

According to an exemplary embodiment, the access control circuit 1310 is configured to perform the decryption of the encrypted user profile and the encrypted command using a single decryption algorithm. By way of example, the decryption algorithm may be or include a Counter with Cipher Block Chaining-Message Authentication Code ("CCM") algorithm as described in further detail in Recommendation for Block Cipher Modes of Operation: the CCM Mode for Authentication and Confidentiality published by the National Institute of Standards and Technology in May 2004 and authored by Morris Dworkin, which is incorporated herein by reference in its entirety.

In some embodiments, the two key authentication scheme using the device key and the user key eliminates any need to pair (e.g., using Bluetooth pairing, etc.) the locking system 1300 to the user devices 1900 to create a secure communication session between the locking system 1300 and the user devices 1900. In such embodiments, the locking system 1300, therefore, does not store the user keys received from the user devices 1900 after a communication session between the locking system 1300 and the user devices 1900 ends (e.g., after implementing the command, due to the inability to decrypt the encrypted command, in response to a lack of receiving an encrypted command for a predefined period of time, etc.).

It should be understood that the two key authentication scheme implemented by the access control circuit 1310 described herein is not meant to be limiting, but is provided as an example of one possible way to provide secure communication between the user devices 1900 and the locking system 1300. In other embodiments, secure communication is otherwise established by the access control circuit 1310 using a different authentication scheme such as an authentication scheme that employs digital signatures, challenge-response procedures, multi-factor authentication (e.g., two-factor authentication, user profile plus a biometric, a user profile plus a PIN, etc.), and/or still other suitable authentication schemes. In still other embodiments, the door server 1700 performs the access control decision, which is then transmitted to the locking system 1300 through the user device 1900, through the wireless bridge 1200/wireless router 1600, or directly. In yet other embodiments, the controller 1500 performs the access control decision, which is then transmitted to the locking system 1300 directly (e.g., via Bluetooth, through a wired connection, etc.) or indirectly (e.g., through the wireless bridge 1200, through the wireless router 1600, etc.).

The bridge circuit 1312 is configured to convert a first wireless signal received by the first transceiver 1322 in the first wireless communication protocol (e.g., BLE, cellular, etc.) to a second wireless signal in the second communication protocol (e.g., Wi-Fi, BLE, etc.) to be emitted by the second transceiver 1324. The bridge circuit 1312 may be also configured to convert the second wireless signal received by the second transceiver 1324 in the second wireless communication protocol to the first wireless signal in the first communication protocol to be emitted by the first transceiver 1322. Accordingly, the locking system 1300 may function as a wireless bridge (e.g., the wireless bridge 1200, etc.).

Camera System

Figures 16, 17:
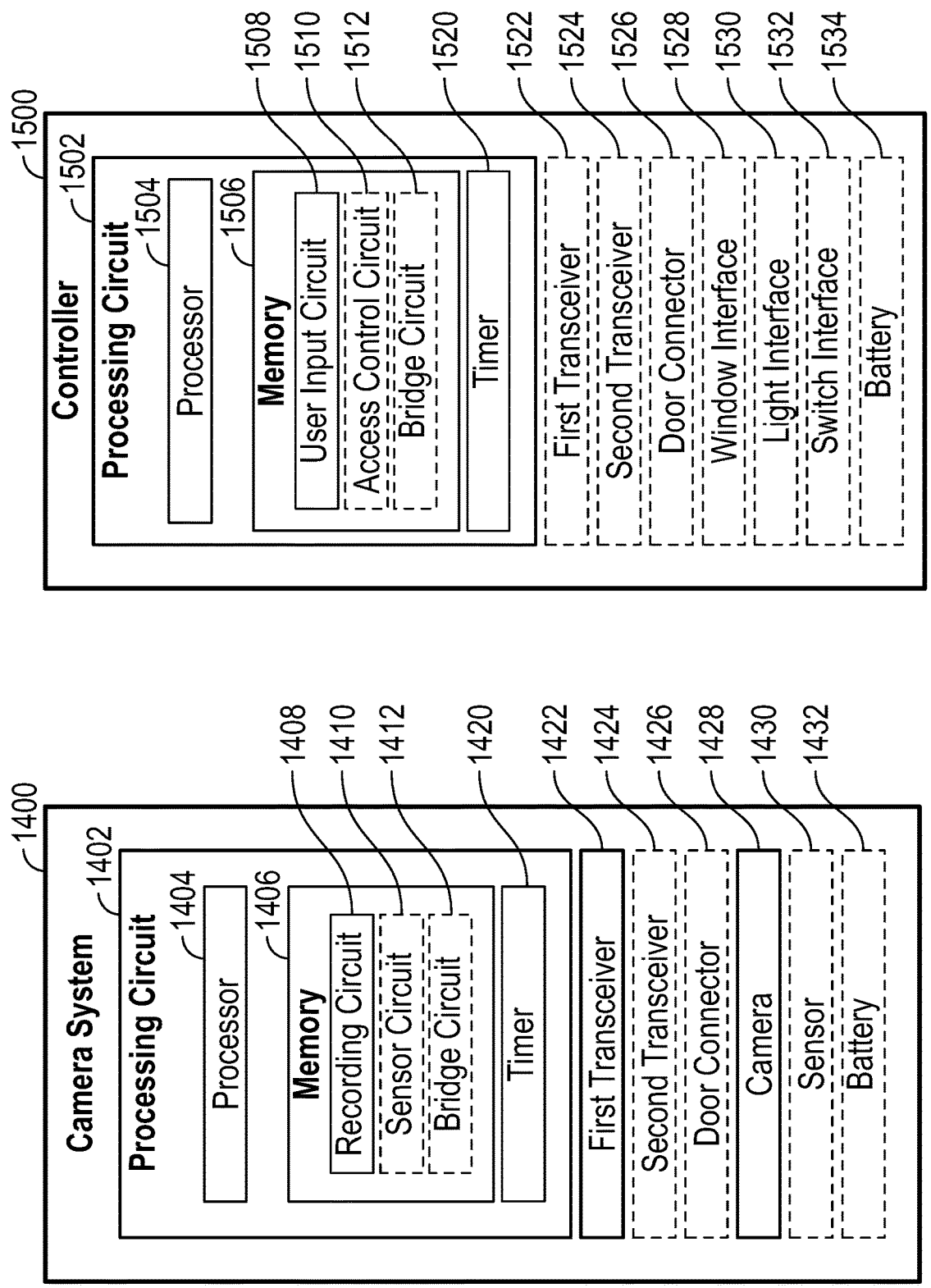
FIG. 16 is a block diagram of a camera system of the door assembly of FIGS. 12 and 13, according to an exemplary embodiment.
FIG. 17 is a block diagram of a controller of the door assembly of FIGS. 12 and 13, according to an exemplary embodiment.

In general, the camera system 1400 is configured to acquire video data regarding an environment outside the door 1102. The video data may be stored locally and/or remotely in the camera server 1800. As shown in FIG. 16, the camera system 1400 includes a processing circuit 1402, a first transceiver 1422, a second transceiver 1424, a door connector 1426, a camera 1428, a sensor 1430, and a battery 1432. In some embodiments, the camera system 1400 does not include the second transceiver 1424, the door connector 1426, the sensor 1430, and/or the battery 1432. The processing circuit 1402 has a processor 1404, a memory 1406, and a timer 1420. The processing circuit 1402 may include a general-purpose processor, an ASIC, one or more FPGAs, a DSP, circuits containing one or more processing components, circuitry for supporting a microprocessor, a group of processing components, or other suitable electronic processing components. In some embodiments, the processor 1404 is configured to execute computer code stored in the memory 1406 to facilitate the activities described herein. The memory 1406 may be any volatile or non-volatile computer-readable storage medium capable of storing data or computer code relating to the activities described herein. According to an exemplary embodiment, the memory 1406 includes computer code modules (e.g., executable code, object code, source code, script code, machine code, etc.) configured for execution by the processor 1404. The timer 1420 is configured to maintain a time value for the camera system 1400. For example, the timer 1420 may be the clock of the processor 1404 or may be any other time keeping circuit of the camera system 1400. The time value maintained by the timer 1420 may be used in time stamping the video data acquired by the camera system 1400.

According to an exemplary embodiment, the first transceiver 1422 is configured to facilitate wireless communication using a first communication protocol. In one embodiment, the first transceiver 1422 includes wired or wireless (e.g., Wi-Fi) components for communicating with Internet connected devices (e.g., the controller 1500, the wireless router 1600, the user devices 1900, the door server 1700, the camera server 1800, etc.). In another embodiment, the first transceiver 1422 includes cellular components for communicating with the door server 1700, the camera server 1800, and/or the user devices 1900 via a cellular network. In embodiments where the camera system 1400 includes the second transceiver 1424, the second transceiver 1424 is configured to facilitate wireless communication using a second communication protocol. By way of example, the second communication protocol may be a short-range communication protocol. In one embodiment, the second transceiver 1424 includes Bluetooth components for establishing a Bluetooth connection with the user devices 1900, the wireless bridge 1200, the camera system 1400, and/or the controller 1500. In another embodiment, the second transceiver 1424 includes a different type of components that facilitate a different type of short-range and/or wireless communication protocol (e.g., radiofrequency, RFID, ZigBee, Wi-Fi, NFC, etc.).

In embodiments where the camera system 1400 includes the door connector 1426, the door connector 1426 is configured to selectively interface with the camera system interface 1142. In embodiments where the camera system 1400 does not include the door connector 1426, the camera system 1400 may be hardwired within the door 1102. The camera 1428 is a camera device configured to capture the video data. The sensor 1430 may be or include a proximity sensor, a motion sensor, a door bell sensor, and/or still another suitable sensor configured to detect activity outside of or proximate the door 1102. In embodiments that include the battery 1432, the battery 1432 is configured to provide power to the camera system 1400 to facilitate the operation thereof (e.g., sense activity, activate the camera 1428, etc.). The battery 1432 may be rechargeable and/or replaceable. Such a battery operated camera system 1400 may therefore operate in the event of power loss to the building in which the electronic door assembly 1100 is installed. In embodiments that do not include the battery 1432, the camera system 1400 may couple to another power source to facilitate the operation thereof (e.g., the external power source 1602, the internal energy storage 1604, etc.).

As shown in FIG. 16, the memory 1406 of the camera system 1400 includes a recording circuit 1408, a sensor circuit 1410, and a bridge circuit 1412. In some embodiments, the memory 1406 does not include the sensor circuit 1410 (e.g., in embodiments where the camera system 1400 does not include the sensor 1430, etc.) and/or the bridge circuit 1412 (e.g., in embodiments where the electronic door assembly 1100 includes the wireless bridge 1200, in embodiments where the locking system 1300 or the controller 1500 function as a wireless bridge, etc.).

The recording circuit 1408 is configured to control operation of the camera 1428 and control transmission of the video data acquired by the camera 1428 to the camera server 1800. The recording circuit 1408 may transmit the video data upon request, periodically according to a preselected or defined transmission interval, or continuously. The sensor circuit 1410 is configured to receive sensor signals from the sensor 1430 and activate the camera 1428 in response to the sensor signals indicating activity at or proximate the door 1102. In other embodiments (e.g., without the sensor 1430, etc.), the camera 1428 may be continuously active or active during preset time periods.

The bridge circuit 1412 is configured to convert a first wireless signal received by the first transceiver 1422 in the first wireless communication protocol (e.g., Wi-Fi, cellular, etc.) to a second wireless signal in the second communication protocol (e.g., BLE, Wi-Fi, etc.) to be emitted by the second transceiver 1424. The bridge circuit 1412 may be also configured to convert the second wireless signal received by the second transceiver 1424 in the second wireless communication protocol to the first wireless signal in the first communication protocol to be emitted by the first transceiver 1422. Accordingly, the camera system 1400 may function as a wireless bridge (e.g., the wireless bridge 1200, etc.).

Controller

In general, the controller 1500 is configured to facilitate controlling operation of one or more components of the electronic door assembly 1100 based on a command received thereby. The controller 1500 may receive the command from the switch 1606, directly from the user device 1900, and/or indirectly from the user device 1900 through the door server 1700, the wireless router 1600, and/or the wireless bridge 1200. In some embodiments, the controller 1500 is configured to receive an encrypted user profile from a respective user device 1900 or the door server 1700 (e.g., directly, indirectly through the wireless bridge 1200, indirectly through the wireless router 1600, etc.) and make an access and/or a management control decision based on the encrypted user profile (e.g., whether to permit unlocking, updating, activation, etc. by the respective user device 1900). In some embodiments (e.g., embodiments where the electronic door assembly 1100 does not include the controller 1500, etc.), the functions of the controller 1500 described herein may be performed by the locking system 1300. In some embodiments, the functions of the locking system 1300 described herein may be performed by the controller 1500. In some embodiments, operation of the controller 1500 is independent of the locking system 1300 (e.g., the controller 1500 and the locking system 1300 perform independent authentication processes, etc.).

As shown in FIG. 17, the controller 1500 includes a processing circuit 1502, a first transceiver 1522, a second transceiver 1524, a door connector 1526, a window interface 1528, a light interface 1530, a switch interface 1532, and a battery 1534. In some embodiments, the controller 1500 does not include the first transceiver 1522, the second transceiver 1524, the door connector 1526, the window interface 1528, the light interface 1530, the switch interface 1532, and/or the battery 1534. The processing circuit 1502 has a processor 1504, a memory 1506, and a timer 1520. The processing circuit 1502 may include a general-purpose processor, an ASIC, one or more FPGAs, a DSP, circuits containing one or more processing components, circuitry for supporting a microprocessor, a group of processing components, or other suitable electronic processing components. In some embodiments, the processor 1504 is configured to execute computer code stored in the memory 1506 to facilitate the activities described herein. The memory 1506 may be any volatile or non-volatile computer-readable storage medium capable of storing data or computer code relating to the activities described herein. According to an exemplary embodiment, the memory 1506 includes computer code modules (e.g., executable code, object code, source code, script code, machine code, etc.) configured for execution by the processor 1504. The timer 1520 is configured to maintain a time value for the controller 1500. For example, the timer 1520 may be the clock of the processor 1504 or may be any other time keeping circuit of the controller 1500. The time value maintained by the timer 1520 may be used in secured communications (e.g., in syncing time with the user devices 1900, in providing timestamps related to events for logging purposes, etc.).

In embodiments where the controller 1500 includes the first transceiver 1522, the first transceiver 1522 is configured to facilitate wireless communication using a first communication protocol. By way of example, the first communication protocol may be a short-range communication protocol. In one embodiment, the first transceiver 1522 includes Bluetooth components for establishing a Bluetooth connection with the user devices 1900, the wireless bridge 1200, the camera system 1400, and/or the locking system 1300. In another embodiment, the first transceiver 1522 includes a different type of components that facilitate a different type of short-range and/or wireless communication protocol (e.g., radiofrequency, RFID, ZigBee, Wi-Fi, NFC, etc.). In embodiments where the controller 1500 includes the second transceiver 1524, the second transceiver 1524 is configured to facilitate wireless communication using a second communication protocol. In one embodiment, the second transceiver 1524 includes wired or wireless (e.g., Wi-Fi) components for communicating with Internet connected devices (e.g., the camera system 1400, the locking system 1300, the wireless router 1600, the user devices 1900, the door server 1700, the camera server 1800, etc.). In another embodiment, the second transceiver 1524 includes cellular components for communicating with the door server 1700, the camera server 1800, and/or the user devices 1900 via a cellular network.

In embodiments where the controller 1500 includes the door connector 1526, the door connector 1526 is configured to selectively interface with the controller interface 1172. In embodiments where the controller 1500 does not include the door connector 1526, the controller 1500 may be hardwired within the door 1102 or separate from the door 1102. In embodiments where the controller 1500 includes the window interface 1528 (e.g., when the door 1102 includes the window 1112, the windows 1118, etc.), the window interface 1528 is configured to connect the controller 1500 to the window 1112 and/or the windows 1118 to facilitate providing commands to the blocker 1114 and the blockers 1120, respectively. In embodiments where the controller 1500 includes the light interface 1530 (e.g., when the door 1102 includes the lighting system 1122, etc.), the light interface 1530 is configured to connect the controller 1500 to the lighting system 1122 to facilitate providing commands to the lights 1124. In embodiments where the controller 1500 includes the switch interface 1532 (e.g., when the electronic door assembly 1100 includes the switch 1606, etc.), the switch interface 1532 is configured to connect the controller 1500 to the switch 1606 to facilitate user control of the blocker 1114, the blockers 1120, and/or the lights 1124 with the switch 1606.

In embodiments where the controller 1500 includes the battery 1534, the battery 1534 is configured to provide power to the controller 1500 to facilitate the operation thereof (e.g., receiving commands, providing commands, etc.). The battery 1534 may be rechargeable and/or replaceable. Such a battery operated controller 1500 may therefore operate in the event of power loss to the building in which the electronic door assembly 1100 is installed. In embodiments that do not include the battery 1534, the controller 1500 may couple to another power source to facilitate the operation thereof (e.g., the external power source 1602, the internal energy storage 1604, etc.). In some embodiments, the controller 1500 includes an input/output port (e.g., a USB port, a COM port, a networking port, etc.) that may be used to establish a physical connection to another device. For example, such a physical connection may be used by a manufacturer or installer to program or otherwise communicate with the controller 1500.

According to an exemplary embodiment, the memory 1506 of the controller 1500 includes various modules or circuits configured to facilitate controlling operation of one or more components of the electronic door assembly 1100. As shown in FIG. 17, the memory 1506 of the controller 1500 includes a user input circuit 1508, an access control circuit 1510, and a bridge circuit 1512. In some embodiments, the memory 1506 does not include the access control circuit 1510 (e.g., in embodiments where the controller 1500 does not perform authentication procedures, etc.) and/or the bridge circuit 1512 (e.g., in embodiments where the electronic door assembly 1100 includes the wireless bridge 1200, in embodiments where the camera system 1400 or the locking system 1300 function as a wireless bridge, etc.).

The user input circuit 1508 is configured to receive inputs from the switch 1606, the user devices 1900 (e.g., directly, indirectly, etc.), the door server 1700, and/or the camera server 1800. By way of example, the user input circuit 1508 may receive an encrypted user profile and/or an encrypted command from a respective user device 1900 or the door server 1700 (e.g., directly, indirectly, etc.). By way of another example, the user input circuit 1508 may receive a first input from the switch 1606 to activate/deactivate the blocker 1114 and/or the blockers 1120 and/or receive a second input from the switch 1606 to turn on/turn off the lights 1124. By way of yet another example, the user input circuit 1508 may receive an updated or new device key from the door server 1700 (e.g., through the user device 1900 and/or the wireless bridge 1200, through the wireless router 1600 and/or the wireless bridge 1200, etc.).

The access control circuit 1510 is configured to store a device identifier and/or a device key. The access control circuit 1510 may be configured to broadcast the device identifier via the first transceiver 1522. In response to the broadcast or in response to a user selecting the electronic door assembly 1100 associated with the controller 1500 in an app, the controller 1500 may receive an associated encrypted user profile from a respective user device 1900 or the door server 1700. The access control circuit 1510 is configured to decrypt the encrypted user profile using (i) the device key pre-stored thereon and/or (ii) a handshake nonce appended to the encrypted user profile (in embodiments where the handshake nonce is used) to obtain a user key from the decrypted user profile. In some embodiments, the access control circuit 1510 is configured to generate and transmit a reply nonce to the respective user device 1900 or the door sever 1700 via the first transceiver 1522 or the second transceiver 1524 (e.g., depending on the proximity of the user device 1900 to the controller 1500, depending on whether the controller 1500 only includes the first transceiver 1522, etc.) in response to successfully decrypting the encrypted user profile.

The access control circuit 1510 may receive an encrypted command from the respective user device 1900 or the door server 1700 (e.g., after successfully decrypting the encrypted user profile, etc.) via the first transceiver 1522 or the second transceiver 1524 (e.g., depending on the proximity of the user device 1900 to the controller 1500, depending on whether the controller 1500 only includes the first transceiver 1522, etc.). The access control circuit 1510 is configured to decrypt the encrypted command using the user key obtained from the decrypted user profile. In some embodiments, the access control circuit 1510 is configured to generate a modified reply nonce based on the reply nonce to decrypt the encrypted command along with the user key (in embodiments where the access control circuit 1510 generates and transmits the reply nonce to the user device 1900 and the user device 1900 generates and encrypts the command with the user key and the modified reply nonce). The access control circuit 1510 is configured to initiate an action specified by the decrypted command (e.g., unlocking a physical locking component, implementing a firmware update, turn on/off lights, activating/deactivating blockers, etc.) in response to successfully decrypting the encrypted command. A similar procedure may be performed between the wireless bridge 1200 and the access control circuit 1510 based on an encrypted bridge profile and encrypted command received from the wireless bridge 1200, as described in more detail herein. The access control circuit 1510 is configured to initiate a communication session between the controller 1500 and the wireless bridge 1200 following such a successful procedure.

According to an exemplary embodiment, the access control circuit 1510 is configured to perform the decryption of the encrypted user profile and the encrypted command using a single decryption algorithm. By way of example, the decryption algorithm may be or include a Counter with Cipher Block Chaining-Message Authentication Code ("CCM") algorithm as described in further detail in Recommendation for Block Cipher Modes of Operation: the CCM Mode for Authentication and Confidentiality published by the National Institute of Standards and Technology in May 2004 and authored by Morris Dworkin.

In some embodiments, the two key authentication scheme using the device key and the user key eliminates any need to pair (e.g., using Bluetooth pairing, etc.) the controller 1500 to the user devices 1900 to create a secure communication session between the controller 1500 and the user devices 1900. In such embodiments, the controller 1500, therefore, does not store the user keys received from the user devices 1900 after a communication session between the controller 1500 and the user devices 1900 ends (e.g., after implementing the command, due to the inability to decrypt the encrypted command, in response to a lack of receiving an encrypted command for a predefined period of time, etc.).

It should be understood that the two key authentication scheme implemented by the access control circuit 1510 described herein is not meant to be limiting, but is provided as an example of one possible way to provide secure communication between the user devices 1900 and the controller 1500. In other embodiments, secure communication is otherwise established by the access control circuit 1510 using a different authentication scheme such as an authentication scheme that employs digital signatures, challenge-response procedures, multi-factor authentication (e.g., two-factor authentication, user profile plus a biometric, a user profile plus a PIN, etc.), and/or still other suitable authentication schemes. In still other embodiments, the door server 1700 performs the control decisions, which is then transmitted to the controller 1500 through the user device 1900, through the wireless bridge 1200/wireless router 1600, or directly. In yet other embodiments, the locking system 1300 performs the control decisions, which are then transmitted to the controller 1500 directly (e.g., via Bluetooth, through a wired connection, etc.) or indirectly (e.g., through the wireless bridge 1200, through the wireless router 1600, etc.). While the authentication scheme implemented by the controller 1500 and the locking system 1300 are disclosed herein to be the same, in other embodiments, (i) the controller 1500 and the locking system 1300 implement different authentication schemes or (ii) authentication to one of the controller 1500 or the locking system 1300 automatically grants access to the other (i.e., both don't have to run independent authentication schemes).

The bridge circuit 1512 is configured to convert a first wireless signal received by the first transceiver 1522 in the first wireless communication protocol (e.g., BLE, cellular, etc.) to a second wireless signal in the second communication protocol (e.g., Wi-Fi, BLE, etc.) to be emitted by the second transceiver 1524. The bridge circuit 1512 may be also configured to convert the second wireless signal received by the second transceiver 1524 in the second wireless communication protocol to the first wireless signal in the first communication protocol to be emitted by the first transceiver 1522. Accordingly, the controller 1500 may function as a wireless bridge (e.g., the wireless bridge 1200, etc.).

In some embodiments (e.g., where the controller 1500 is Wi-Fi capable, cellular capable, etc.), the controller 1500 is configured to discover electronics coupled to the door 1102 and automatically register the components to the door server 1700. By way of example, the controller 1500 may detect that a locking system 1300 is installed in the door 1102 (e.g., the door connector 1326 is inserted into the locking system interface 1132, etc.). The controller 1500 may then pull data from the locking system 1300 and transmit that data to the door server 1700, which may subsequently link the locking system 1300 with the user profiles associated with the respective door 1102. Accordingly, when user profiles are transmitted to the user devices 1900 associated with the respective door 1102 by the door server 1700, the user profiles may include the data necessary to access the locking system 1300 (e.g., without any user interaction necessary to link the locking system 1300 to the door 1102 and/or their user devices 1900, etc.).

Door Server

Figure 18:
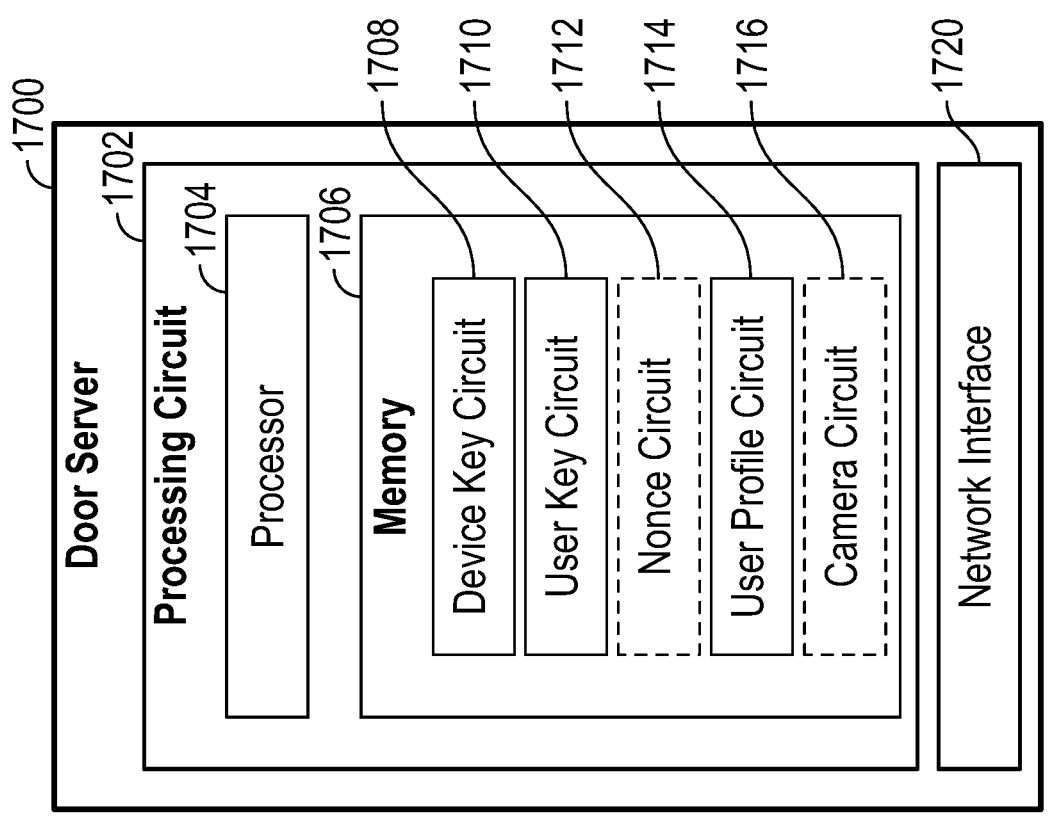
FIG. 18 is a block diagram of a door server of the electronic door system of FIG. 11, according to an exemplary embodiment.

As shown in FIG. 18, the door server 1700 includes a processing circuit 1702 and a network interface 1720. The processing circuit 1702 has a processor 1704 and a memory 1706. The processing circuit 1702 may include a general-purpose processor, an application specific integrated circuit ("ASIC"), one or more field programmable gate arrays ("FPGAs"), a digital-signal-processor ("DSP"), circuits containing one or more processing components, circuitry for supporting a microprocessor, a group of processing components, or other suitable electronic processing components. In some embodiments, the processor 1704 is configured to execute computer code stored in the memory 1706 to facilitate the activities described herein. The memory 1706 may be any volatile or non-volatile computer-readable storage medium capable of storing data or computer code relating to the activities described herein. According to an exemplary embodiment, the memory 1706 includes computer code modules (e.g., executable code, object code, source code, script code, machine code, etc.) configured for execution by the processor 1704.

According to an exemplary embodiment, the network interface 1720 is configured to facilitate wireless communication from and to the door server 1700 (i) directly to and from the camera server 1800, (ii) directly to and from the user devices 1900, (iii) directly to and from at least one of the components of the electronic door assembly 1100, (iv) indirectly to and from at least one of the components of the electronic door assembly 1100 through the user devices 1900 and/or the wireless bridge 1200, (v) indirectly to and from at least one of the components of the electronic door assembly 1100 through the wireless router 1600 and/or the wireless bridge 1200, and/or (vi) indirectly to and from at least one of the components of the electronic door assembly 1100 through the user devices 1900 and/or the wireless router 1600.

According to an exemplary embodiment, the memory 1706 of the door server 1700 includes various modules or circuits configured to (i) generate and securely store the device keys, the user keys, the bridge keys, the user profiles, and the bridge profiles and (ii) selectively and/or dynamically deliver encrypted user profiles and/or encrypted bridge profiles (e.g., each including an associated user key, bridge key, etc.) to the user devices 1900 and/or the wireless bridges 1200 based on one or more factors such as, for example, the location of the user devices 1900, the permissions of the users (e.g., clearance/authorization level, time schedule, etc.) of the user devices 1900, and/or still other possible factors.

As shown in FIG. 18, the memory 1706 of the door server 1700 includes a device key circuit 1708, a user key circuit 1710, a nonce circuit 1712, a user profile circuit 1714, and a camera circuit 1716. In some embodiments, the memory 1706 does not include the nonce circuit 1712 and/or the camera circuit 1716. Further, the type of modules or circuits within the memory 1706 may vary depending on the authentication scheme utilized. By way of example, when the two-key authentication protocol described herein is used, the door server 1700 may include the device key circuit 1708, the user key circuit 1710, the nonce circuit 1712, and/or the user profile circuit 1714. By way of another example, when a different authentication protocol is used, the door server 1700 may include various other types of modules or circuits to perform such authentication protocols.

The device key circuit 1708 is configured to generate and securely store the device keys (e.g., which may be provided to the locking system 1300 and/or the controller 1500 at the time of manufacturing, etc.). As an example, the device key circuit 1708 may correspond to a first database of keys and may include the software configured to store and retrieve such keys from the first database. The device key circuit 1708 may be further configured to facilitate updating, replacing, or deleting the device keys (e.g., if a respective device key on a respective locking system 1300 and/or controller 1500 is compromised, etc.), which may be propagated to the associated locking system 1300 and/or controller 1500 using the methods described herein (e.g., directly, indirectly, etc.).

The user key circuit 1710 is configured to generate and securely store the user keys (e.g., when a user is registered to a respective locking system 1300, controller 1500, etc.). As an example, the user key circuit 1710 may correspond to a second database of keys and may include the software configured to store and retrieve such keys from the second database. The user key circuit 1710 may be further configured to facilitate updating, replacing, or deleting the user keys (e.g., if a user's access is revoked, if a user key expires, etc.), which may be updated in the associated user profile as necessary. While not shown, the door server 1700 may also include a bridge key circuit. The bridge key circuit may be configured to generate and securely store bridge keys. As an example, the bridge key circuit may correspond to a third database of keys and may include the software configured to store and retrieve such keys from the third database.

The nonce circuit 1712 is configured to generate a handshake nonce for each of the user profiles each time the user profiles are transmitted to the user devices 1900. In some embodiments, the handshake nonce is not used. In some embodiments, the nonce circuit 1712 is configured to generate a handshake nonce for each of the bridge profiles each time the bridge profiles are transmitted to the wireless bridges 1200.

The user profile circuit 1714 is configured to generate and securely store the user profiles. As an example, the user profile circuit 1714 may correspond to a fourth database of user profiles and may include the software configured to store and retrieve such user profiles from the fourth database. The user profile circuit 1714 may be further configured to facilitate updating, replacing, or deleting the user profiles. By way of example, the user profile circuit 1714 may be configured to generate a user profile for a specific user, locking system 1300, and/or controller 1500 when a new user is added to a respective locking system 1300, added to a respective controller 1500, in response to a respective user profile expiring, etc. The user profile circuit 1714 is further configured to encrypt the user profiles prior to or as they are being transmitted to the user devices 1900. By way of example, when a user profile is transmitted to a respective user device 1900, the user profile circuit 1714 may be configured to (i) insert the associated user key into or append the associated user key to the user profile, (ii) encrypt the user profile and user key using (a) the device key associated with a specific locking system 1300 and/or controller 1500 and/or (b) the handshake nonce (in embodiments where the handshake nonce is used) to generate an encrypted user profile, and/or (iii) append (a) the user key and/or (b) the handshake nonce (in embodiments where the handshake nonce is used) to the encrypted user profile. The user profile circuit 114 may be further configured to facilitate updating, replacing, or deleting the user profiles (e.g., if a user's access is revoked, if a user key is updated, etc.).

While not shown, the door server 1700 may also include a bridge profile circuit. The bridge profile circuit is configured to generate and securely store the bridge profiles. As an example, the bridge profile circuit may correspond to a fifth database of bridge profiles and may include the software configured to store and retrieve such bridge profiles from the fifth database. The bridge profile circuit may be further configured to facilitate updating, replacing, or deleting the bridge profiles. The bridge profile circuit is further configured to encrypt the bridge profiles prior to or as they are being transmitted to the wireless bridges 1200. By way of example, when a bridge profile is transmitted to a respective wireless bridge, the bridge profile circuit may be configured to (i) insert the associated bridge key into or append the associated bridge key to the user profile, (ii) encrypt the bridge profile and bridge key using (a) the device key associated with a specific door component or device (e.g., the locking system 1300, the camera system 1400, the controller 1500, etc.) and/or (b) the handshake nonce (in embodiments where the handshake nonce is used) to generate an encrypted bridge profile, and/or (iii) append (a) the bridge key and/or (b) the handshake nonce (in embodiments where the handshake nonce is used) to the encrypted bridge profile.

The camera circuit 1716 is configured to access the camera server 1800 to facilitate accessing the camera server 1800 with the user devices 1900. By way of example, in some implementations, the user devices 1900 may not be able to access the camera server 1800 directly. Instead, the user devices 1900 may request to access the camera server 1800 through an app stored on the user devices 1900, which will cause a request to be sent to the camera circuit 1716, which will subsequently contact the camera server 1800. If the camera server 1800 approves the access request, the camera circuit 1716 may relay pre-stored video, a live video stream, and/or provide other control functionality to the user devices 1900.

Camera Server

Figure 19:
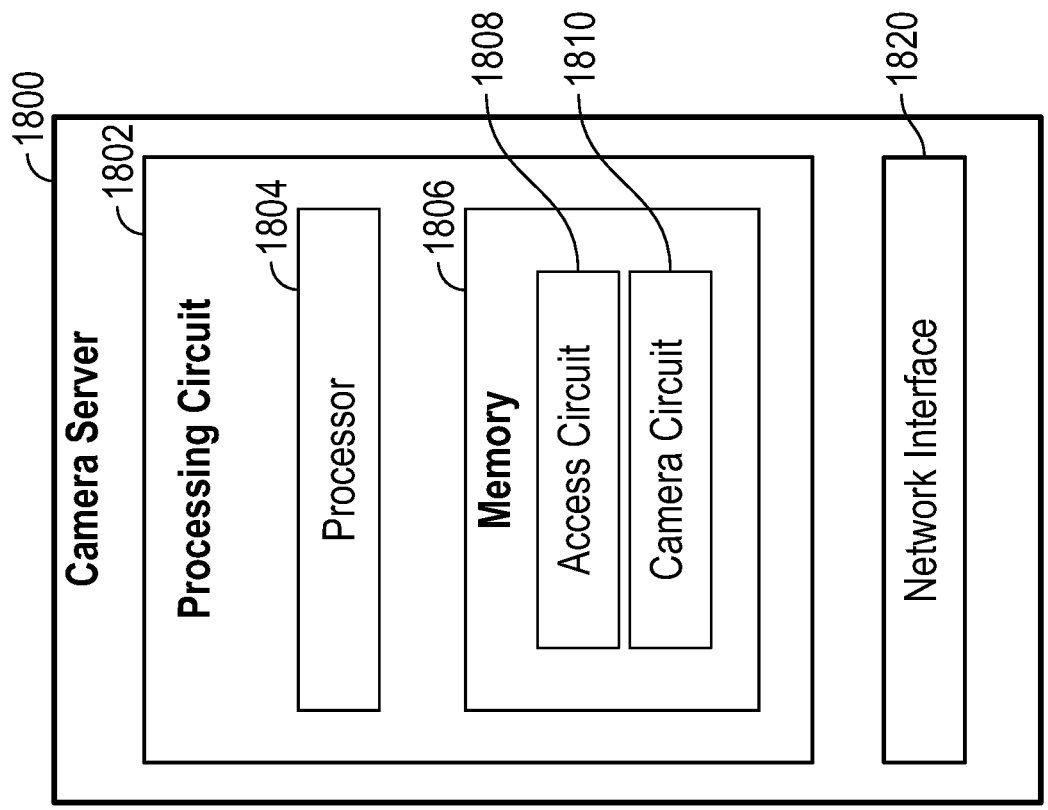
FIG. 19 is a block diagram of a camera server of the electronic door system of FIG. 11, according to an exemplary embodiment.

As shown in FIG. 19, the camera server 1800 includes a processing circuit 1802 and a network interface 1820. The processing circuit 1802 has a processor 1804 and a memory 1806. The processing circuit 1802 may include a general-purpose processor, an application specific integrated circuit ("ASIC"), one or more field programmable gate arrays ("FPGAs"), a digital-signal-processor ("DSP"), circuits containing one or more processing components, circuitry for supporting a microprocessor, a group of processing components, or other suitable electronic processing components. In some embodiments, the processor 1804 is configured to execute computer code stored in the memory 1806 to facilitate the activities described herein. The memory 1806 may be any volatile or non-volatile computer-readable storage medium capable of storing data or computer code relating to the activities described herein. According to an exemplary embodiment, the memory 1806 includes computer code modules (e.g., executable code, object code, source code, script code, machine code, etc.) configured for execution by the processor 1804.

According to an exemplary embodiment, the network interface 1820 is configured to facilitate wireless communication from and to the camera server 1800 (i) directly to and from the door server 1700, (ii) directly to and from the user devices 1900, (iii) directly to and from the camera system 1400, (iv) indirectly to and from the user devices 1900, (v) indirectly to and from the camera system 1400 through the user devices 1900 and/or the wireless bridge 1200, (vi) indirectly to and from the camera system 1400 through the wireless router 1600 and/or the wireless bridge 1200, and/or (vii) indirectly to and from the camera system 1400 through the user devices 1900 and/or the wireless router 1600.

According to an exemplary embodiment, the memory 1806 of the camera server 1800 includes various modules or circuits configured to receive, store, and transmit video data acquired by the camera system 1400 to the user devices 1900. As shown in FIG. 19, the memory 1806 of the camera server 1800 includes an access circuit 1808 and a camera circuit 1810. The camera circuit 1810 is configured to receive and store video data acquired by the camera system 1400. The access circuit 1808 is configured to determine whether a respective user device 1900 is permitted to access the camera data stored in the camera circuit 1810. According to an exemplary embodiment, a user is able to link a camera system 1400 to their user profile (e.g., at the time of installing the camera system 1400 in the door 1102, etc.). Accordingly, when the user attempts to access the video data (e.g., through the camera circuit 1716 of the door server 1700, etc.), the access circuit 1808 is configured to determine if the user profile on the user device 1900 attempting to access the camera data is associated with the camera system 1400 that acquired the video data. If so, the access circuit 1808 is configured to transmit the video data to the user device 1900 for viewing (e.g., directly, through the camera circuit 1716 of the door server 1700, etc.). In some embodiments, the user devices 1900 can access a live video feed directly from the camera system 1400 without having to go through the camera server 1800. In such embodiments, the camera system 1400 may be configured to implement a similar authentication scheme described herein in relation to the locking system 1300 and the controller 1500.

User Device

In general, the user device 1900 is configured to selectively receive and store an encrypted user profile from the door server 1700 to facilitate accessing and/or at least partially managing the operation of one or more components of the electronic door assembly 1100 to which the user device 1900 has access. By way of example, the user device 1900 may be used to unlock, lock, and/or otherwise manage the function of the locking system 1300 (e.g., change settings, update firmware, etc. directly through the locking system 1300 or indirectly through the controller 1500). By way of another example, the user device 1900 may be used to activate, deactivate, and/or otherwise manage the function of the lighting system 1122, the window 1112, and/or the windows 1118 (e.g., through the controller 1500, through the locking system 1300, etc.). By way of yet another example, the user device 1900 may be used to (i) activate and deactivate the camera system 1400 and/or (ii) view live and/or pre-recorded video captured by the camera system 1400. The user device 1900 may access, control, and/or manage various components of the electronic door system 1000 through the use of an application ("app") that is configured to run on the user device 1900. For example, the app may be installed on a mobile phone or other portable device, and the app may be used to configure, control, and/or communicate with the wireless bridge 1200, the locking system 1300, the camera system 1400, the controller 1500, the wireless router 1600, the door server 1700, and/or the camera server 1800 over a wireless connection. In some embodiments, the user device 1900 is a portable device such as a smartphone, a cell phone, a mobile phone, a tablet, a smart watch, a laptop computer, and/or another type of suitable portable device. In another embodiment, the user device 1900 is a desktop computer (e.g., connected to the electronic door assembly 1100 via a wired connection, remote from the electronic door assembly 1100, etc.).

Figure 20:
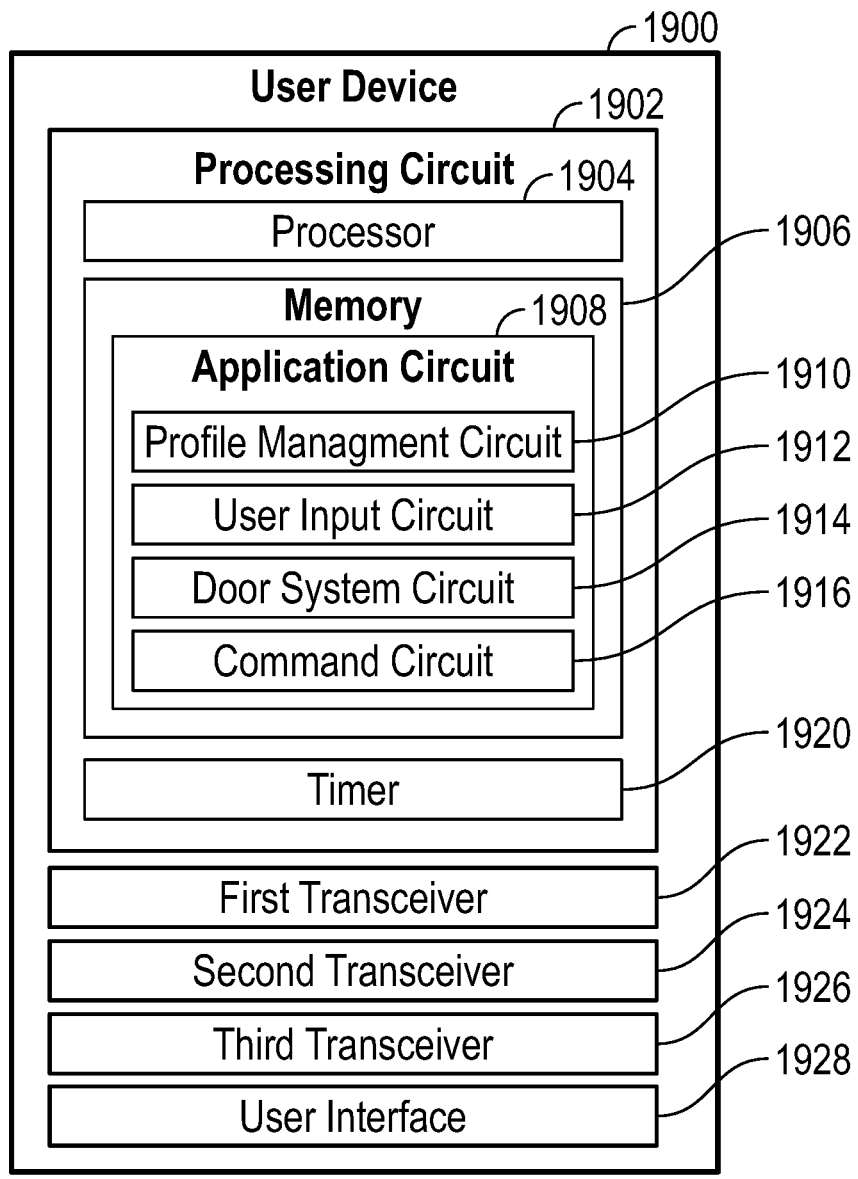
FIG. 20 is a block diagram of a user device useable with the electronic door system of FIG. 11, according to an exemplary embodiment.

As shown in FIG. 20, the user device 1900 includes a processing circuit 1902, a first transceiver 1922, a second transceiver 1924, a third transceiver 1926, and a user interface 1928. The processing circuit 1902 has a processor 1904, a memory 1906, and a timer 1920. The processing circuit 1902 may include a general-purpose processor, an ASIC, one or more FPGAs, a DSP, circuits containing one or more processing components, circuitry for supporting a microprocessor, a group of processing components, or other suitable electronic processing components. In some embodiments, the processor 1904 is configured to execute computer code stored in the memory 1906 to facilitate the activities described herein. The memory 1906 may be any volatile or non-volatile computer-readable storage medium capable of storing data or computer code relating to the activities described herein. According to an exemplary embodiment, the memory 1906 includes computer code modules (e.g., executable code, object code, source code, script code, machine code, etc.) configured for execution by the processor 1904. The timer 1920 is configured to maintain a time value for the user device 1900. For example, the timer 1920 may be the clock of the processor 1904 or may be any other time keeping circuit of the user device 1900. The time value maintained by the timer 1920 may be used in secured communications (e.g., in syncing time with the locking system 1300, in providing timestamps related to events for logging purposes, etc.).

According to an exemplary embodiment, (i) the first transceiver 1922 is configured to facilitate communicating with one or more of the components of the electronic door system 1000 using a first communication protocol, (ii) the second transceiver 1924 is configured to facilitate communicating with one or more of the components of the electronic door system 1000 using a second communication protocol, and (iii) the third transceiver 1926 is configured to facilitate communicating with one or more of the components of the electronic door system 1000 using a third communication protocol. By way of example, (i) at least one of the first communication protocol, the second communication protocol, or the third communication protocol may be a long-range communication protocol and (ii) at least one of the first communication protocol, the second communication protocol, or the third communication protocol may be a short-range communication protocol. In one embodiment, the first transceiver 1922 includes cellular components for communicating with (i) the door server 1700 and/or the camera server 1800 via a cellular network and/or (ii) the electronic door assembly 1100 through the door server 1700 and/or the camera server 1800. In some embodiments, the cellular components facilitate communicating directly with components of the electronic door assembly 1100 directly (e.g., without the door server 1700, the camera server 1800, the wireless router 1600, the wireless bridge 1200, etc. functioning as an intermediary; one or more components of the electronic door assembly 1100 include cellular components; etc.). In one embodiment, the second transceiver 1924 includes wireless (e.g., Wi-Fi, etc.) components for communicating with (i) the door server 1700 and/or the camera server 1800 over the Internet or other network, (ii) one or more components of the electronic door assembly 1100 directly (e.g., when in Wi-Fi range, etc.), and/or (iii) one or more components of the electronic door assembly 1100 indirectly through the wireless bridge 1200, wireless router 1600, the door server 1700, and/or the camera server 1800 (e.g., when connected to an internet connection, etc.). In one embodiment, the third transceiver 1926 includes Bluetooth components for establishing a Bluetooth connection with (i) one or more components of the electronic door assembly 1100 directly (e.g., when in range of Bluetooth compatible components of the electronic door assembly 1100, etc.) and/or (ii) one or more components of the electronic door assembly 1100 indirectly through the wireless bridge 1200 (e.g., when in Bluetooth range of the wireless bridge 1200 and when attempting to communicate with non-Bluetooth compatible components of the electronic door assembly 1100, etc.). In another embodiment, the third transceiver 1926 includes a different type of components that facilitate a different type of short-range and/or wireless communication protocol (e.g., radiofrequency, RFID, ZigBee, NFC, etc.). In some embodiments, the user device 1900 does not include one or more of the first transceiver 1922, the second transceiver 1924, and the third transceiver 1926.

The user interface 1928 may include a display screen and/or one or more user input devices (e.g., touch screens, buttons, microphones, speakers, displays, keyboards, stylus inputs, mice, track pads, etc.) to allow a user to interact with the user device 1900, the locking system 1300, the camera system 1400, the controller 1500, the door server 1700, the camera server 1800, and/or any apps running on the user device 1900.

According to an exemplary embodiment, the memory 1906 of the user device 1900 includes various modules or circuits configured to receive, manage, and transmit the encrypted user profiles and/or the encrypted commands. As shown in FIG. 20, the memory 1906 of the user device 1900 includes an application circuit 1908 having a profile management circuit 1910, a user input circuit 1912, a door system circuit 1914, and a command circuit 1918.

The profile management circuit 1910 is configured to receive and store the encrypted user profiles and user keys sent to the first transceiver 1922 and/or the second transceiver 1924 of the user device 1900 by the door server 1700. The user input circuit 1912 is configured to (i) provide various graphical user interfaces on a display of the user interface 1928 and (ii) receive inputs provided to the user interface 1928 by the user and perform functions associated therewith. The door system circuit 1914 is configured to identify a respective electronic door assembly 1100 that the user device 1900 is trying to access (e.g., based on an identifier broadcasted by a respective locking system 1300, a respective controller 1500, etc.; based on an electronic door assembly 1100 selected in the app on the user device 1900; etc.) and provide the corresponding encrypted user profile (e.g., without the appended user key, with the handshake nonce appended, etc.) stored in the profile management circuit 1910 to the first transceiver 1922, the second transceiver 1924, and/or the third transceiver 1926 (depending on the current connections available and the proximity of the user device 1900 to the electronic door assembly 1100) to deliver the encrypted user profile to the respective electronic door assembly 1100 to facilitate controlling various functions of the respective electronic door assembly 1100 (e.g., unlock, lock, change settings, update firmware, turn on lights, activate blockers, etc.).

The command circuit 1916 is configured to generate and transmit an encrypted command to the respective electronic door assembly 1100. The encrypted command may include a command for the respective locking system 1300 to perform some action such as unlock, lock, change settings, update firmware, etc. The encrypted command may include a command for the respective controller 1500 to perform some action such as unlock, lock, change settings, update firmware, turn on lights, turn off lights, activate blockers, deactivate blockers, activate camera, deactivate camera, etc. The encrypted command may include a command for the respective camera system 1400 to activate, deactivate, provide a live feed, etc. According to an exemplary embodiment, the command is encrypted using the user key associated with the user profile that was transmitted to a component of the respective electronic door assembly 1100 at the start of the communication session. In some embodiments, the command circuit 1916 is configured to generate a modified reply nonce based on a reply nonce received from the component of the respective electronic door assembly 1100 as described in more detail herein (e.g., in response to the component of the respective electronic door assembly 1100 successfully decrypting the encrypted user profile, etc.). In such embodiments, the command circuit 1916 is configured to encrypt the command using both the user key and the modified reply nonce.

Communication Processes

Figure 21:
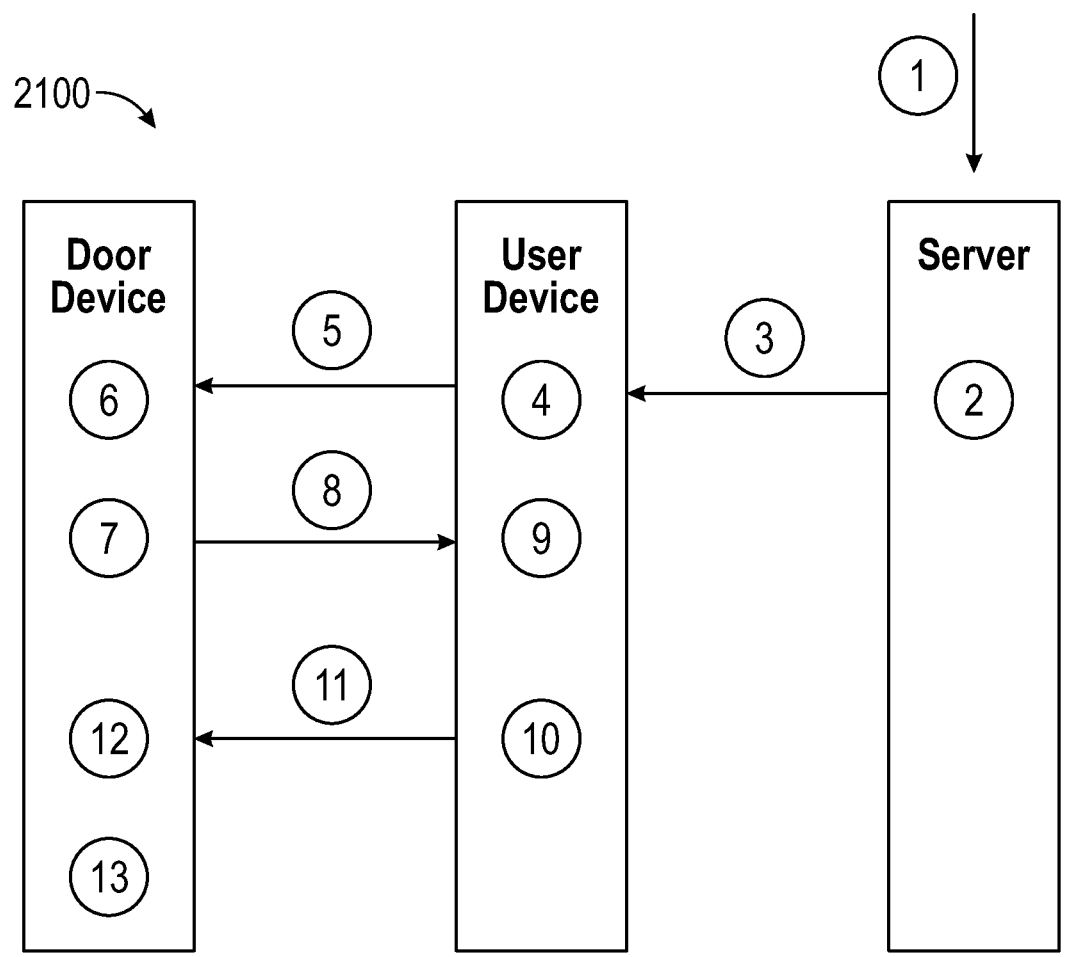
FIG. 21 is a schematic block diagram of a first communication process between components of the electronic door system of FIG. 11, according to an exemplary embodiment.

Referring now to FIGS. 21-25, various possible communication processes between components of the electronic door system 1000 are shown according to various exemplary embodiments. As shown in FIG. 21, a first communication process 2100 is shown according to an embodiment where a user device (e.g., the user device 1900, etc.) is within communication range (e.g., BLE, Wi-Fi, cellular, etc.) of a door device (e.g., the locking system 1300, the camera system 1400, the controller 1500, etc.) such that the user device can communicate directly with the door device via a short-range communication protocol or a long-range communication protocol (e.g., without an intermediary device, etc.). At ACT1, a server (e.g., the door server 1700, etc.) receives a request to add a user or the user device to a door system (e.g., the door system 1000, etc.) including the door device. At ACT2, the server is configured to generate an encrypted user profile in response to the request. The server is configured to encrypt the user profile and a user key with a device key associated with the door device and a handshake nonce. The server is configured to append the user key associated with the user device and the handshake nonce to the encrypted user profile. At ACT3, the server is configured to transmit the encrypted user profile to the user device.

At ACT4, the user device is configured to store the user key appended to the encrypted user profile. At ACT5, the user device is configured to transmit the encrypted user profile with the handshake nonce appended thereto to the door device. At ACT6, the door device is configured to decrypt the encrypted user profile with a pre-stored device key and the appended handshake nonce to obtain the user key from the decrypted user profile. At ACT7, the door device is configured to generate a reply nonce. At ACT8, the door device is configured to transmit the reply nonce to the user device.

At ACT9, the user device is configured to generate a modified reply nonce based on the reply nonce received from the door device. At ACT10, the user device is configured to generate an encrypted command. The command is encrypted using the user key and the modified reply nonce. At ACT11, the user device is configured to transmit the encrypted command to the door device. At ACT12, the door device is configured to generate a modified reply nonce based on the reply nonce (i.e., independent of the user device). At ACT13, the door device is configured to decrypt the encrypted command using the user key obtained from the user profile and the modified reply nonce. The door device is then configured to perform an action specified by the decrypted command. It should be understood that, in some implementations, the handshake nonce, the reply nonce, and the modified reply nonce are omitted from the first communication process 2100.

Figure 22:
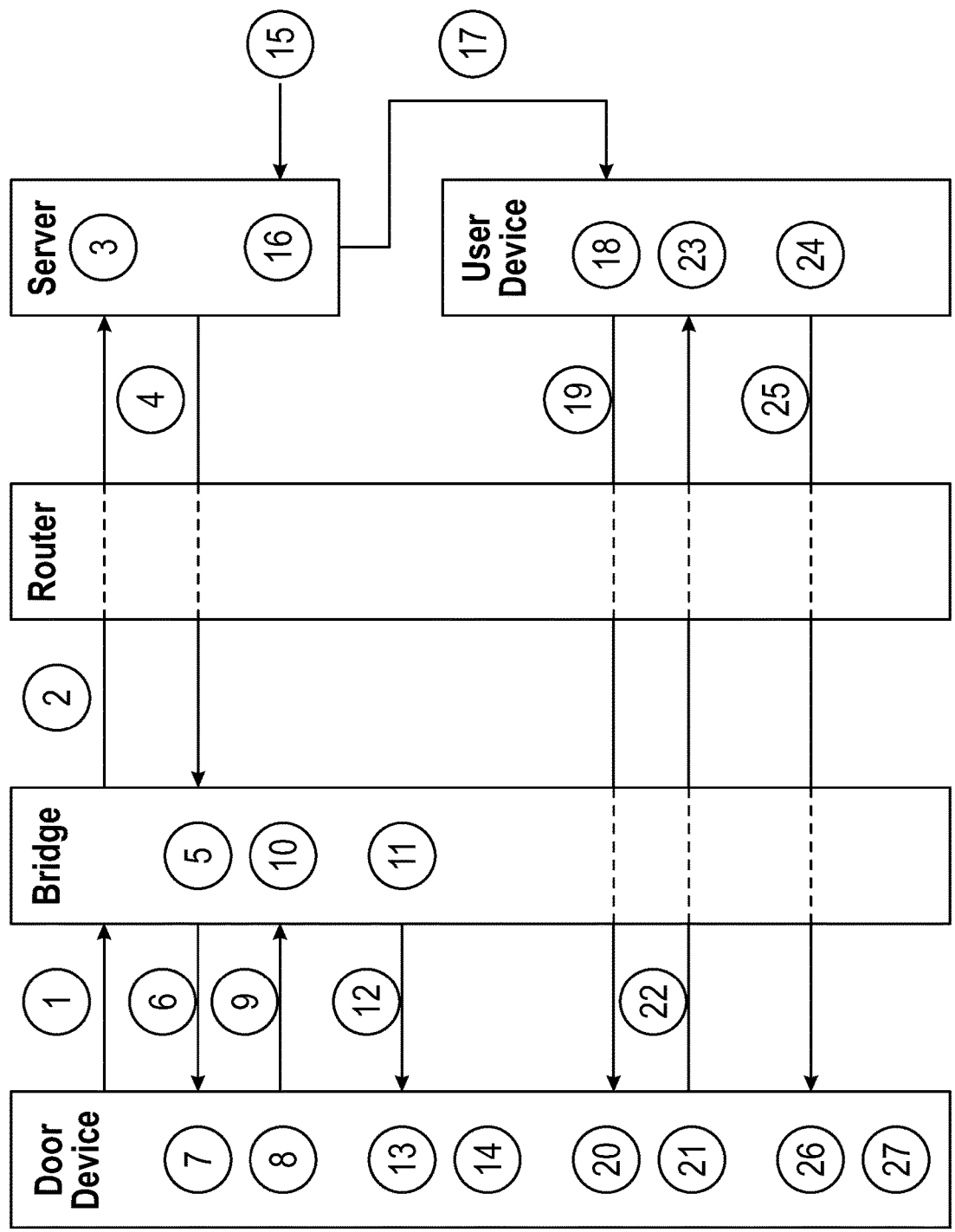
FIG. 22 is a schematic block diagram of a second communication process between components of the electronic door system of FIG. 11, according to an exemplary embodiment.

As shown in FIG. 22, a second communication process 2200 is shown according to an embodiment where a user device (e.g., the user device 1900, etc.) is not within short-range communication (e.g., BLE, etc.) of a door device (e.g., the locking system 1300, the camera system 1400, the controller 1500, etc.) but is within short-range communication (e.g., Wi-Fi, etc.) of an intermediary device (e.g., the wireless bridge 1200, the wireless router 1600, etc.) such that the user device can communicate with the door device via a short-range communication protocol through the intermediary device. At ACT1, the door device is configured to broadcast a device identifier (e.g., periodically, continuously, when awoken, etc.). At ACT2, a bridge (e.g., the wireless bridge 1200, etc.) is configured to receive the device identifier and transmit a request for a bridge profile with the device identifier to a server (e.g., the door server 1700, etc.) through a router (e.g., the wireless router 1600, etc.).

At ACT3, the server is configured to generate an encrypted bridge profile in response to the request and based on the device identifier. The server is configured to encrypt the bridge profile and a bridge key with a device key associated with the door device and a handshake nonce. The server is configured to append the bridge key associated with the bridge and the handshake nonce to the encrypted bridge profile. At ACT4, the server is configured to transmit the encrypted bridge profile to the bridge through the router.

At ACT5, the bridge is configured to store the bridge key appended to the encrypted bridge profile. At ACT6, the bridge is configured to transmit the encrypted bridge profile with the handshake nonce appended thereto to the door device. At ACT7, the door device is configured to decrypt the encrypted bridge profile with a pre-stored device key and the appended handshake nonce to obtain the bridge key from the decrypted bridge profile. At ACT8, the door device is configured to generate a reply nonce. At ACT9, the door device is configured to transmit the reply nonce to the bridge.

At ACT10, the bridge is configured to generate a modified reply nonce based on the reply nonce received from the door device. At ACT11, the bridge is configured to generate an encrypted command. The command is encrypted using the bridge key and the modified reply nonce. At ACT12, the bridge is configured to transmit the encrypted command to the door device. At ACT13, the door device is configured to generate a modified reply nonce based on the reply nonce (i.e., independent of the bridge). At ACT14, the door device is configured to decrypt the encrypted command using the bridge key obtained from the bridge profile and the modified reply nonce. The door device is then configured to perform an action specified by the decrypted command, in this instance, initiate a communication session between the bridge and the door device.

At ACT15, the server receives a request to add a user or the user device to a door system (e.g., the door system 1000, etc.) including the door device. ACT15 can come before, during, or after ACT1-ACT14. At ACT16, the server is configured to generate an encrypted user profile in response to the request. The server is configured to encrypt the user profile and a user key with a device key associated with the door device and a handshake nonce. The server is configured to append the user key associated with the user device and the handshake nonce to the encrypted user profile. At ACT17, the server is configured to transmit the encrypted user profile to the user device. In some embodiments, ACT17 includes transmitting the encrypted user profile to the user device through the router.

At ACT18, the user device is configured to store the user key appended to the encrypted user profile. At ACT19, the user device is configured to transmit the encrypted user profile to the door device through the router and the bridge. At ACT20, the door device is configured to decrypt the encrypted user profile with the pre-stored device key and the appended handshake nonce to obtain the user key from the decrypted user profile. At ACT21, the door device is configured to generate a reply nonce. At ACT22, the door device is configured to transmit the reply nonce to the user device through the bridge and the router.

At ACT23, the user device is configured to generate a modified reply nonce based on the reply nonce received from the door device. At ACT24, the user device is configured to generate an encrypted command. The command is encrypted using the user key and the modified reply nonce. At ACT25, the user device is configured to transmit the encrypted command to the door device through the router and the bridge. At ACT26, the door device is configured to generate a modified reply nonce based on the reply nonce (i.e., independent of the user device). At ACT27, the door device is configured to decrypt the encrypted command using the user key obtained from the user profile and the modified reply nonce. The door device is then configured to perform an action specified by the decrypted command.

It should be understood that, in some implementations, the handshake nonce, the reply nonce, and the modified reply nonce are omitted from the second communication process 2200. In some embodiments, the bridge does not perform ACT2 until the user device performs ACT19 (e.g., the bridge requests the bridge profile to establish communication with the door device after the user device requests access such that continuous communication with the door device is not necessary). In some embodiments, the bridge does not perform ACT6 until the user device performs ACT19 (e.g., the bridge establishes communication with the door device after the user device requests access such that continuous communication with the door device is not necessary, etc.). In some instances, ACT19, ACT22, and ACT25 are performed between the user device, the bridge, and the door device and not the router (e.g., when the user device is in range of the bridge, etc.).

Figure 23:
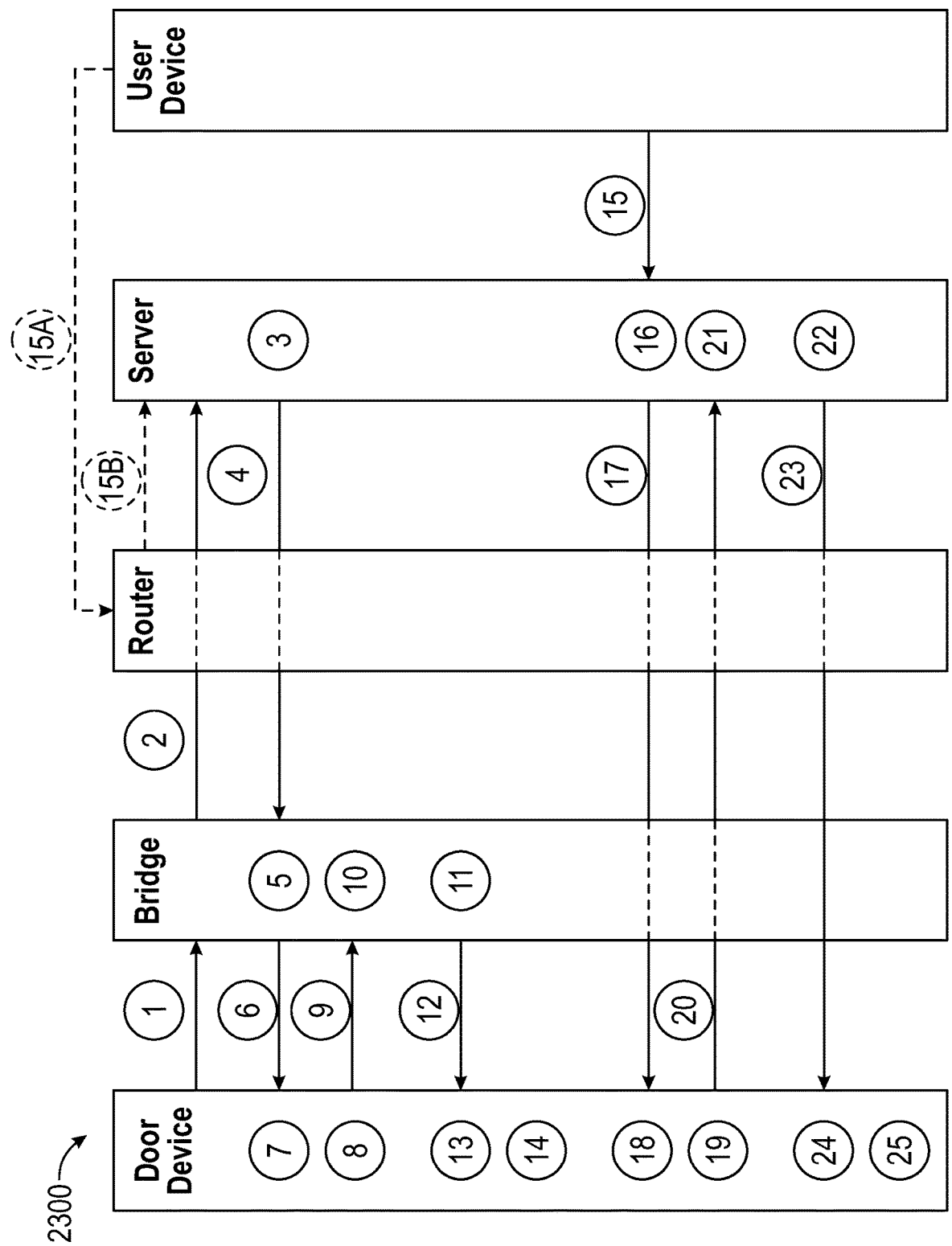
FIG. 23 is a schematic block diagram of a third communication process between components of the electronic door system of FIG. 11, according to an exemplary embodiment.

As shown in FIG. 23, a third communication process 2300 is shown according to an embodiment where a user device (e.g., the user device 1900, etc.) is not within short-range communication (e.g., BLE, Wi-Fi, etc.) of a door device (e.g., the locking system 1300, the camera system 1400, the controller 1500, etc.) or an intermediary device (e.g., the wireless bridge 1200, the wireless router 1600, etc.). At ACT1, the door device is configured to broadcast a device identifier (e.g., periodically, continuously, when awoken, etc.). At ACT2, a bridge (e.g., the wireless bridge 1200, etc.) is configured to receive the device identifier and transmit a request for a bridge profile with the device identifier to a server (e.g., the door server 1700, etc.) through a router (e.g., the wireless router 1600, etc.).

At ACT3, the server is configured to generate an encrypted bridge profile in response to the request and based on the device identifier. The server is configured to encrypt the bridge profile and a bridge key with a device key associated with the door device and a handshake nonce. The server is configured to append the bridge key associated with the bridge and the handshake nonce to the encrypted bridge profile. At ACT4, the server is configured to transmit the encrypted bridge profile to the bridge through the router.

At ACT5, the bridge is configured to store the bridge key appended to the encrypted bridge profile. At ACT6, the bridge is configured to transmit the encrypted bridge profile with the handshake nonce appended thereto to the door device. At ACT7, the door device is configured to decrypt the encrypted bridge profile with a pre-stored device key and the appended handshake nonce to obtain the bridge key from the decrypted bridge profile. At ACT8, the door device is configured to generate a reply nonce. At ACT9, the door device is configured to transmit the reply nonce to the bridge.

At ACT10, the bridge is configured to generate a modified reply nonce based on the reply nonce received from the door device. At ACT11, the bridge is configured to generate an encrypted command. The command is encrypted using the bridge key and the modified reply nonce. At ACT12, the bridge is configured to transmit the encrypted command to the door device. At ACT13, the door device is configured to generate a modified reply nonce based on the reply nonce (i.e., independent of the bridge). At ACT14, the door device is configured to decrypt the encrypted command using the bridge key obtained from the bridge profile and the modified reply nonce. The door device is then configured to perform an action specified by the decrypted command, in this instance, initiate a communication session between the bridge and the door device.

At ACT15, the user device is configured to transmit an access request to the server to access the door device. In some embodiments (e.g., in instances where the user device 1900 is within short-range communication of the wireless router 1600, etc.), ACT15 is replaced with ACT15A and ACT15B. At ACT15A, the user device is configured to transmit an access request to the router. At ACT15B, the router is configured to transmit the access request to the server. At ACT16, the server is configured to generate an encrypted user profile in response to the request. The server is configured to encrypt the user profile and a user key with the device key associated with the door device and a handshake nonce. The server is configured to append the handshake nonce to the encrypted user profile. At ACT17, the server is configured to transmit the encrypted user profile to the door device through the router and the bridge.

At ACT18, the door device is configured to decrypt the encrypted user profile with the pre-stored device key and the appended handshake nonce to obtain the user key from the decrypted user profile. At ACT19, the door device is configured to generate a reply nonce. At ACT20, the door device is configured to transmit the reply nonce to the server through the bridge and the router.

At ACT21, the server is configured to generate a modified reply nonce based on the reply nonce received from the door device. At ACT22, the server is configured to generate an encrypted command based on the access request. The command is encrypted using the user key and the modified reply nonce. At ACT23, the server is configured to transmit the encrypted command to the door device through the router and the bridge. At ACT24, the door device is configured to generate a modified reply nonce based on the reply nonce (i.e., independent of the server). At ACT25, the door device is configured to decrypt the encrypted command using the user key obtained from the user profile and the modified reply nonce. The door device is then configured to perform an action specified by the decrypted command.

It should be understood that, in some implementations, the handshake nonce, the reply nonce, and the modified reply nonce are omitted from the third communication process 2300. In some embodiments, the bridge does not perform ACT2 until the user device performs ACT15 (e.g., the bridge requests the bridge profile to establish communication with the door device after the user device requests access such that continuous communication with the door device is not necessary). In some embodiments, the bridge does not perform ACT6 until the user device performs ACT15 (e.g., the bridge establishes communication with the door device after the user device requests access such that continuous communication with the door device is not necessary, etc.).

Figure 24:
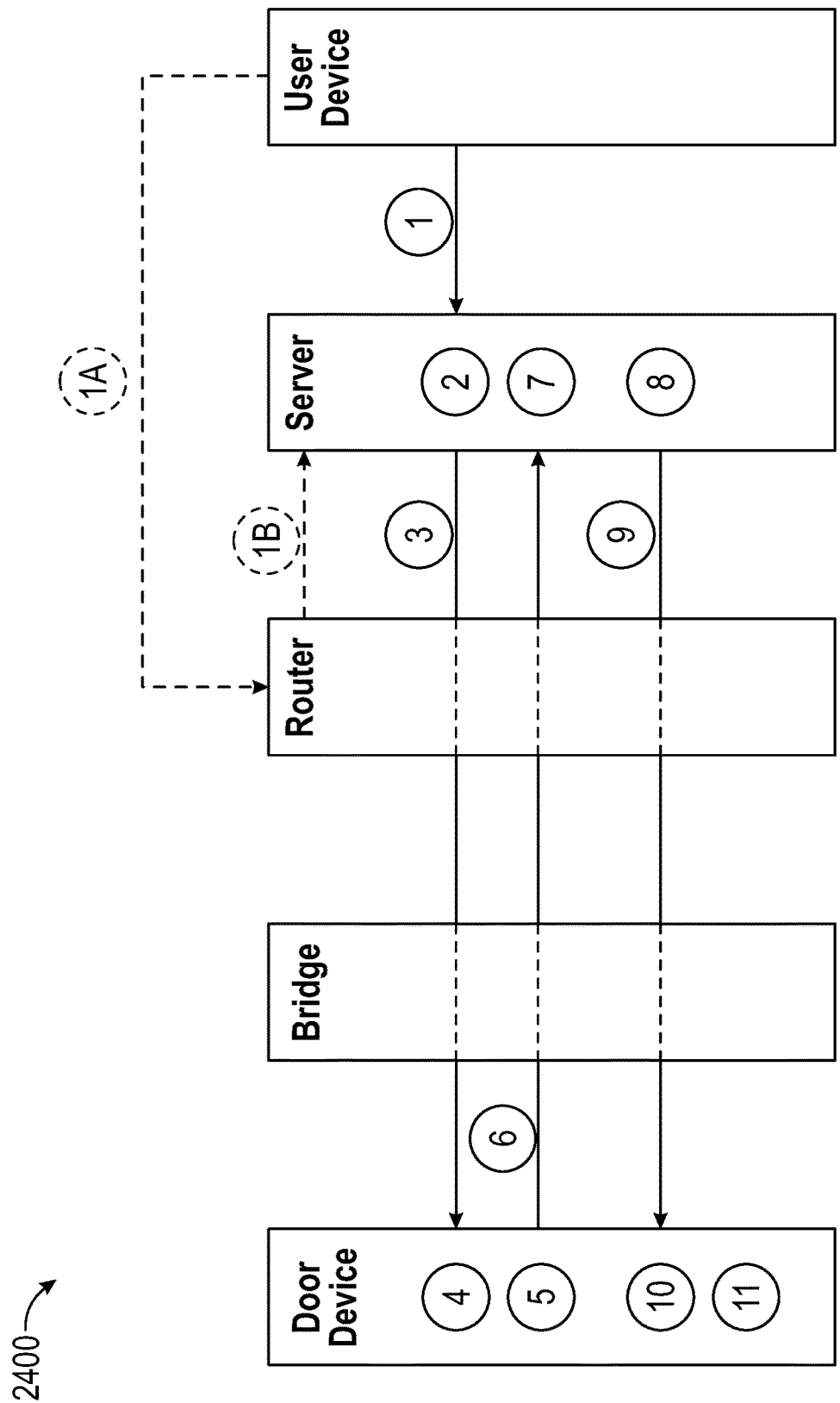
FIG. 24 is a schematic block diagram of a fourth communication process between components of the electronic door system of FIG. 11, according to an exemplary embodiment.

As shown in FIG. 24, a fourth communication process 2400 is shown according to an embodiment where a user device (e.g., the user device 1900, etc.) is not within short-range communication (e.g., BLE, Wi-Fi, etc.) of a door device (e.g., the locking system 1300, the camera system 1400, the controller 1500, etc.) or an intermediary device (e.g., the wireless bridge 1200, the wireless router 1600, etc.). At ACT1, the user device is configured to transmit an access request to the server to access the door device. In some embodiments (e.g., in instances where the user device 1900 is within short-range communication of the wireless router 1600, etc.), ACT1 is replaced with ACT1A and ACT1B. At ACT1A, the user device is configured to transmit an access request to the router. At ACT1B, the router is configured to transmit the access request to the server. At ACT2, the server is configured to generate an encrypted user profile in response to the request. The server is configured to encrypt the user profile and a user key with the device key associated with the door device and a handshake nonce. The server is configured to append the handshake nonce to the encrypted user profile. At ACT3, the server is configured to transmit the encrypted user profile to the door device through the router and the bridge.

At ACT4, the door device is configured to decrypt the encrypted user profile with the pre-stored device key and the appended handshake nonce to obtain the user key from the decrypted user profile. At ACT5, the door device is configured to generate a reply nonce. At ACT6, the door device is configured to transmit the reply nonce to the server through the bridge and the router.

At ACT7, the server is configured to generate a modified reply nonce based on the reply nonce received from the door device. At ACT8, the server is configured to generate an encrypted command based on the access request. The command is encrypted using the user key and the modified reply nonce. At ACT9, the server is configured to transmit the encrypted command to the door device through the router and the bridge. At ACT10, the door device is configured to generate a modified reply nonce based on the reply nonce (i.e., independent of the server). At ACT11, the door device is configured to decrypt the encrypted command using the user key obtained from the user profile and the modified reply nonce. The door device is then configured to perform an action specified by the decrypted command. It should be understood that, in some implementations, the handshake nonce, the reply nonce, and the modified reply nonce are omitted from the fourth communication process 2400.

Figure 25:
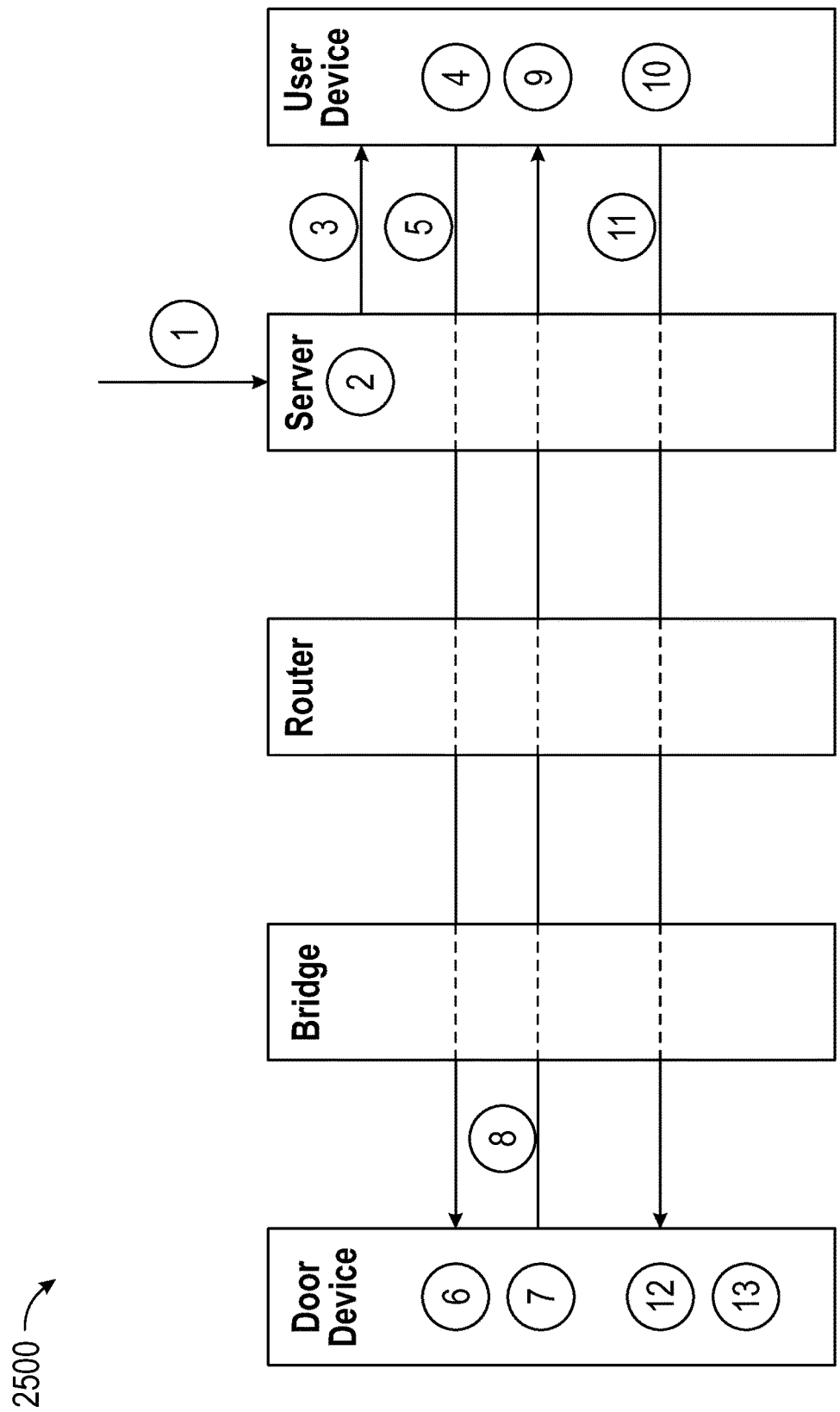
FIG. 25 is a schematic block diagram of a fifth communication process between components of the electronic door system of FIG. 11, according to an exemplary embodiment.

As shown in FIG. 25, a fifth communication process 2500 is shown according to an embodiment where a user device (e.g., the user device 1900, etc.) is not within short-range communication (e.g., BLE, Wi-Fi, etc.) of a door device (e.g., the locking system 1300, the camera system 1400, the controller 1500, etc.) or an intermediary device (e.g., the wireless bridge 1200, the wireless router 1600, etc.). At ACT1, a server (e.g., the door server 1700, etc.) receives a request to add a user or the user device to a door system (e.g., the door system 1000, etc.) including the door device. At ACT2, the server is configured to generate an encrypted user profile in response to the request. The server is configured to encrypt the user profile and a user key with a device key associated with the door device and a handshake nonce. The server is configured to append the user key associated with the user device and the handshake nonce to the encrypted user profile. At ACT3, the server is configured to transmit the encrypted user profile to the user device.

At ACT4, the user device is configured to store the user key appended to the encrypted user profile. At ACT5, the user device is configured to transmit the encrypted user profile with the handshake nonce appended thereto to the door device through the server, the router, and the bridge. At ACT6, the door device is configured to decrypt the encrypted user profile with a pre-stored device key and the appended handshake nonce to obtain the user key from the decrypted user profile. At ACT7, the door device is configured to generate a reply nonce. At ACT8, the door device is configured to transmit the reply nonce to the user device through the bridge, the router, and the server.

At ACT9, the user device is configured to generate a modified reply nonce based on the reply nonce received from the door device. At ACT10, the user device is configured to generate an encrypted command. The command is encrypted using the user key and the modified reply nonce. At ACT11, the user device is configured to transmit the encrypted command to the door device through the server, the router, and the bridge. At ACT12, the door device is configured to generate a modified reply nonce based on the reply nonce (i.e., independent of the user device). At ACT13, the door device is configured to decrypt the encrypted command using the user key obtained from the user profile and the modified reply nonce. The door device is then configured to perform an action specified by the decrypted command. It should be understood that, in some implementations, the handshake nonce, the reply nonce, and the modified reply nonce are omitted from the fifth communication process 2500.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the disclosure as recited in the appended claims.

It should be noted that the term "exemplary" and variations thereof, as used herein to describe various embodiments, are intended to indicate that such embodiments are possible examples, representations, or illustrations of possible embodiments (and such terms are not intended to connote that such embodiments are necessarily extraordinary or superlative examples).

The term "coupled" and variations thereof, as used herein, means the joining of two members directly or indirectly to one another. Such joining may be stationary (e.g., permanent or fixed) or moveable (e.g., removable or releasable). Such joining may be achieved with the two members coupled directly to each other, with the two members coupled to each other using a separate intervening member and any additional intermediate members coupled with one another, or with the two members coupled to each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

References herein to the positions of elements (e.g., "top," "bottom," "above," "below") are merely used to describe the orientation of various elements in the FIGURES. It should be noted that the orientation of various elements may differ according to other exemplary embodiments, and that such variations are intended to be encompassed by the present disclosure.

The hardware and data processing components used to implement the various processes, operations, illustrative logics, logical blocks, modules and circuits described in connection with the embodiments disclosed herein may be implemented or performed with a general purpose single- or multi-chip processor, a digital signal processor (DSP), an application specific integrated circuit (ASIC), a field programmable gate array (FPGA), or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some embodiments, particular processes and methods may be performed by circuitry that is specific to a given function. The memory (e.g., memory, memory unit, storage device) may include one or more devices (e.g., RAM, ROM, Flash memory, hard disk storage) for storing data and/or computer code for completing or facilitating the various processes, layers and modules described in the present disclosure. The memory may be or include volatile memory or non-volatile memory, and may include database components, object code components, script components, or any other type of information structure for supporting the various activities and information structures described in the present disclosure. According to an exemplary embodiment, the memory is communicably connected to the processor via a processing circuit and includes computer code for executing (e.g., by the processing circuit or the processor) the one or more processes described herein.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It is important to note that the construction and arrangement of the door systems and the components thereof as shown in the various exemplary embodiments is illustrative only. Additionally, any element disclosed in one embodiment may be incorporated or utilized with any other embodiment disclosed herein. Although only one example of an element from one embodiment that can be incorporated or utilized in another embodiment has been described above, it should be appreciated that other elements of the various embodiments may be incorporated or utilized with any of the other embodiments disclosed herein.

The invention claimed is:

1. A door system comprising:
a door jamb;
a door panel including a box disposed therealong and embedded therein;
a hinge coupling an edge of the door panel to the door jamb;
a flexible conduit extending from the door jamb to the edge of the door panel;
a plurality of electronic components, wherein the flexible conduit is configured to facilitate electrically coupling one or more of the plurality of electronic components to an external power source, and wherein the plurality of electronic components include:
a camera disposed within the box of the door panel;
a light integrated into the door jamb;
a sensor configured to facilitate detecting at least one of sound or activity proximate the door panel; and
a backup battery disposed within at least one of the door jamb or the door panel, the backup battery configured to power at least one of the plurality of electronic components in an event of power loss from the external power source; and
a control system configured to:
acquire data from one or more of the plurality of electronic components; and
at least one of (i) transmit the data to a server or (ii) control one or more of the plurality of electronic components based on the data.

2. The door system of claim 1, wherein the control system is configured to:
activate the light based on a command received from a user device; and
activate at least one of the light or the camera based on the data, wherein the data includes a signal from the sensor indicating that at least one of sound or activity was detected proximate the door panel.

3. The door system of claim 1, wherein the backup battery only provides power to a subset of the plurality of electronic components during the event of power loss from the external power source.

4. The door system of claim 1, wherein the backup battery is disposed within the door panel.

5. The door system of claim 1, wherein the backup battery is disposed within the door jamb.

6. The door system of claim 1, further comprising a window disposed within the door panel, wherein the window includes privacy glass.

7. The door system of claim 1, wherein the plurality of electronic components include an electronic locking mechanism coupled to the door panel.

8. The door system of claim 1, wherein the control system is configured to transmit the data to the server and control one or more of the plurality of electronic components based on the data.

9. The door system of claim 1, wherein the box includes an electrical interface, and wherein the camera is configured to connect to the electrical interface.

10. The door system of claim 1, wherein the sensor includes at least one of a doorbell sensor, a proximity sensor, or a motion sensor.

11. A door system comprising:
- a door jamb;
- a door panel including a box disposed therealong;
- a hinge coupling an edge of the door panel to the door jamb;
- a flexible conduit extending from the door jamb to the edge of the door panel; and
- a plurality of electronic components, wherein the flexible conduit is configured to facilitate electrically coupling one or more of the plurality of electronic components to an external power source, and wherein the plurality of electronic components include:
  - a camera disposed within the box;
  - a light integrated into the door jamb;
  - a sensor configured to facilitate detecting at least one of sound or activity proximate the door panel; and
  - a backup battery disposed within at least one of the door jamb or the door panel, the backup battery configured to power at least one of the plurality of electronic components in an event of power loss from the external power source.

12. The door system of claim 11, wherein the backup battery is disposed within the door panel.

13. The door system of claim 11, wherein the backup battery is disposed within the door jamb.

14. The door system of claim 11, further comprising a window disposed within the door panel.

15. The door system of claim 14, wherein the window includes privacy glass.

16. The door system of claim 11, further comprising a control system configured to turn on or turn off the light in response to a command received from a user device.

17. The door system of claim 11, further comprising a control system configured to activate at least one of the light or the camera based on a signal received from at least one of the sensor or the camera.

18. The door system of claim 11, wherein the box includes an electrical interface, and wherein the camera is configured to connect to the electrical interface.

19. The door system of claim 11, wherein the sensor includes at least one of a doorbell sensor, a proximity sensor, or a motion sensor.

20. A door system comprising:
- a door jamb;
- a door panel;
- a hinge coupling an edge of the door panel to the door jamb;
- a flexible conduit extending from the door jamb to the edge of the door panel;
- a plurality of electronic components, wherein the flexible conduit is configured to facilitate electrically coupling one or more of the plurality of electronic components to an external power source, and wherein the plurality of electronic components include:
  - a camera;
  - a sensor including at least one of a doorbell sensor, a proximity sensor, or a motion sensor;
  - a light integrated into the door jamb; and
  - a backup battery configured to power at least one of the plurality of electronic components in an event of power loss from the external power source; and
- a control system configured to:
  - turn on or turn off the light in response to a command received from a user device; and
  - activate at least one of the light or the camera based on a signal received from at least one of the sensor or the camera.

* * * * *